(12) United States Patent
Hironaka et al.

(10) Patent No.: US 8,283,945 B2
(45) Date of Patent: Oct. 9, 2012

(54) SEMICONDUCTOR DEVICE

(75) Inventors: Tetsuo Hironaka, Hiroshima (JP);
Kazuya Tanigawa, Hiroshima (JP);
Hiroaki Toguchi, Okazaki (JP); Naoki Hirakawa, Kawasaki (JP); Takashi Ishiguro, Takasaki (JP); Masayuki Sato, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/255,846

(22) PCT Filed: Mar. 24, 2010

(86) PCT No.: PCT/JP2010/055029
§ 371 (c)(1),
(2), (4) Date: Sep. 9, 2011

(87) PCT Pub. No.: WO2010/113713
PCT Pub. Date: Oct. 7, 2010

(65) Prior Publication Data
US 2012/0007635 A1 Jan. 12, 2012

(30) Foreign Application Priority Data
Mar. 30, 2009 (JP) .................................. 2009-083786

(51) Int. Cl.
*G06F 7/38* (2006.01)
*H03K 19/173* (2006.01)
*H03K 3/356* (2006.01)

(52) U.S. Cl. ............................ 326/46; 326/38; 327/208

(58) Field of Classification Search .................... 326/46, 326/37–41; 712/232; 327/201–218
See application file for complete search history.

(56) References Cited

U.S. PATENT DOCUMENTS

| | | | | |
|---|---|---|---|---|
| 6,215,327 B1* | 4/2001 | Lyke | ............................... | 326/41 |
| 6,288,569 B1* | 9/2001 | Wittig et al. | ..................... | 326/41 |
| 6,331,788 B1* | 12/2001 | Lyke | ............................... | 326/39 |
| 6,501,296 B2* | 12/2002 | Wittig et al. | ..................... | 326/39 |
| 7,102,387 B1* | 9/2006 | Lyke | ............................... | 326/41 |
| 7,103,987 B2* | 9/2006 | Kodama et al. | ................. | 33/706 |
| 7,632,745 B2* | 12/2009 | Chen | ............................. | 438/591 |
| 7,932,745 B2* | 4/2011 | Hecht et al. | ..................... | 326/40 |
| 8,010,590 B1* | 8/2011 | Taylor | ............................ | 708/524 |
| 2009/0154282 A1 | 6/2009 | Satoh | | |

FOREIGN PATENT DOCUMENTS

| | | |
|---|---|---|
| JP | H2-020923 A | 1/1990 |
| JP | H11-238850 A | 8/1999 |
| JP | 2000-036738 A | 2/2000 |
| JP | 2002-164780 A | 6/2002 |
| WO | 2007/060738 A | 5/2007 |

* cited by examiner

OTHER PUBLICATIONS

The 23rd International Technical Conference on Circuits/Systems, Computers and Communications (ITC-CSCC, 2008), pp. 557-560, "Low Cost PLD with High Speed Partial Reconfiguration," Naoki Hirakawa, Masayuki Sato, Kazuya Tanigawa, and Tetsuo Hironaka.

*Primary Examiner* — Shawki S Ismail
*Assistant Examiner* — Dylan White
(74) *Attorney, Agent, or Firm* — Law Office of Katsuhiro Arai

(57) ABSTRACT

FPGAs and MPLDs, which are conventional programmable semiconductor devices, have had poor cost performance and did not suitably take long signal lines into account. To solve this, a flip-flop is built into each MLUT block comprised of a plurality of MLUTs, each MLUT comprising a memory and an address-data pair. With respect to the adjacent line between adjacent MLUTs, alternated adjacent line are introduced, while in the case of interconnects between non-adjacent MLUTs, dedicated distant line and, furthermore, a torus interconnect network are provided.

20 Claims, 17 Drawing Sheets

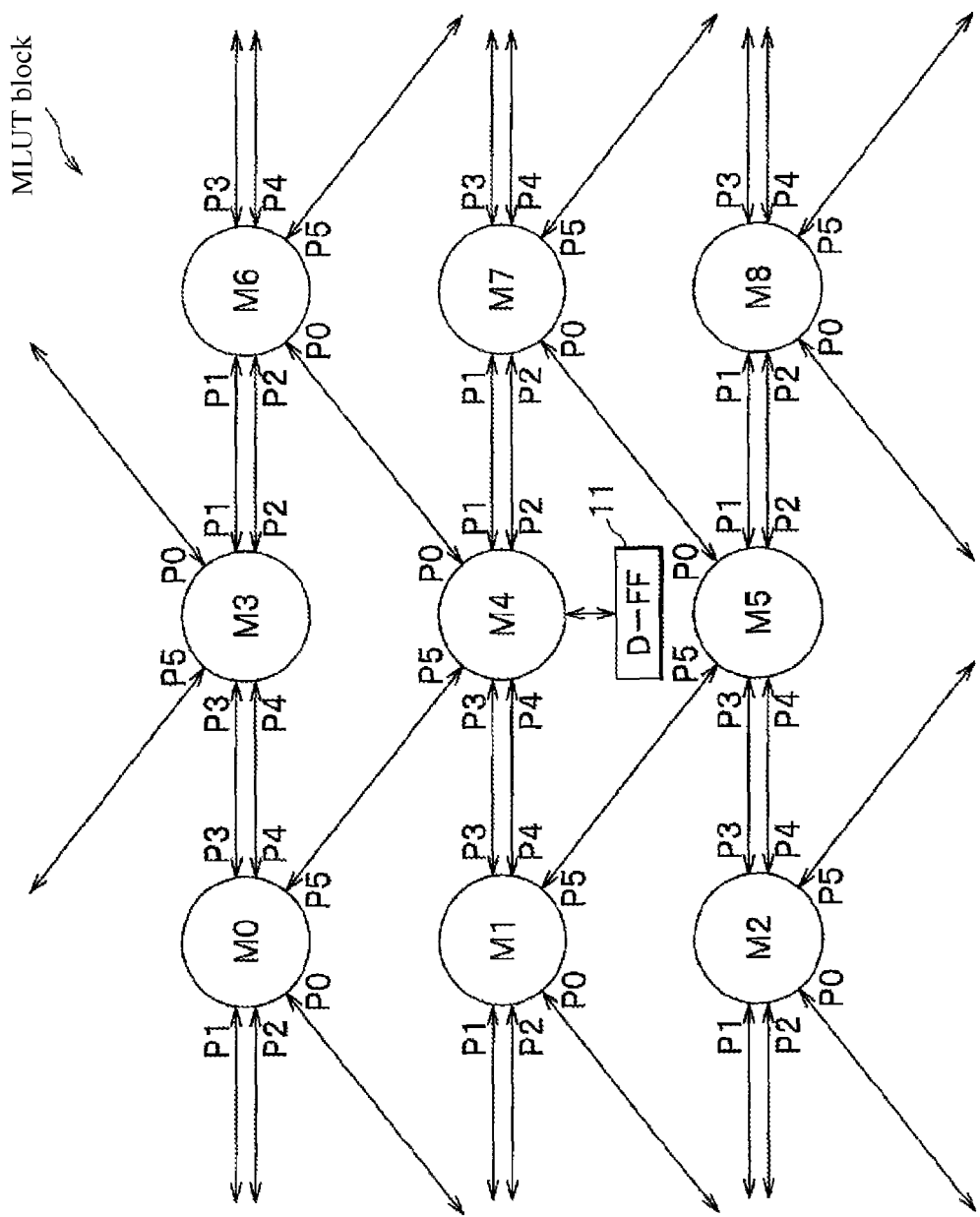
[Fig. 1]

[Fig. 2]
(a)
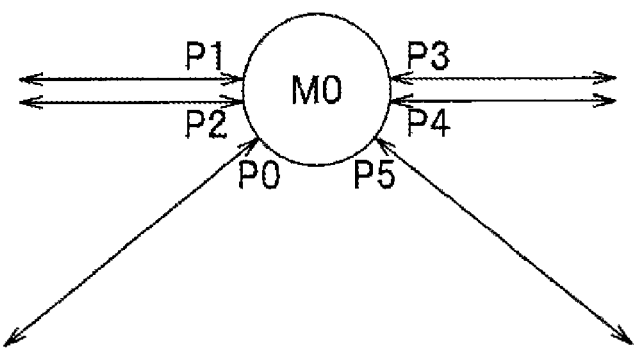
(b)
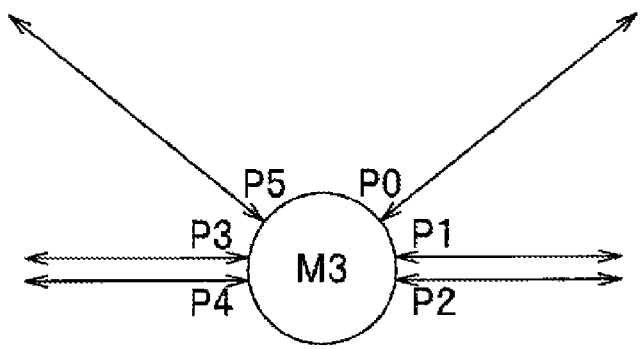
[Fig. 3]
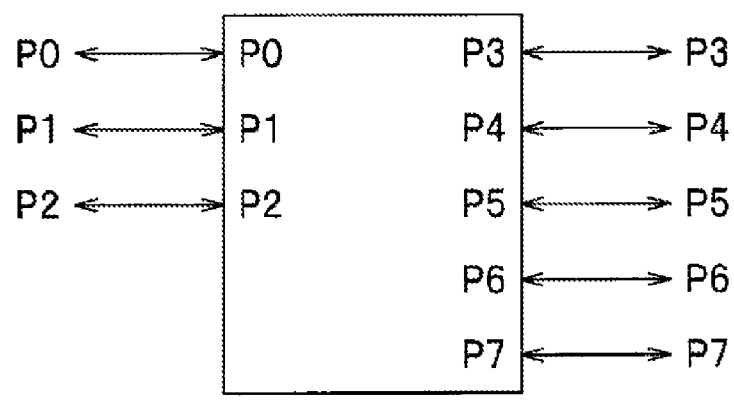

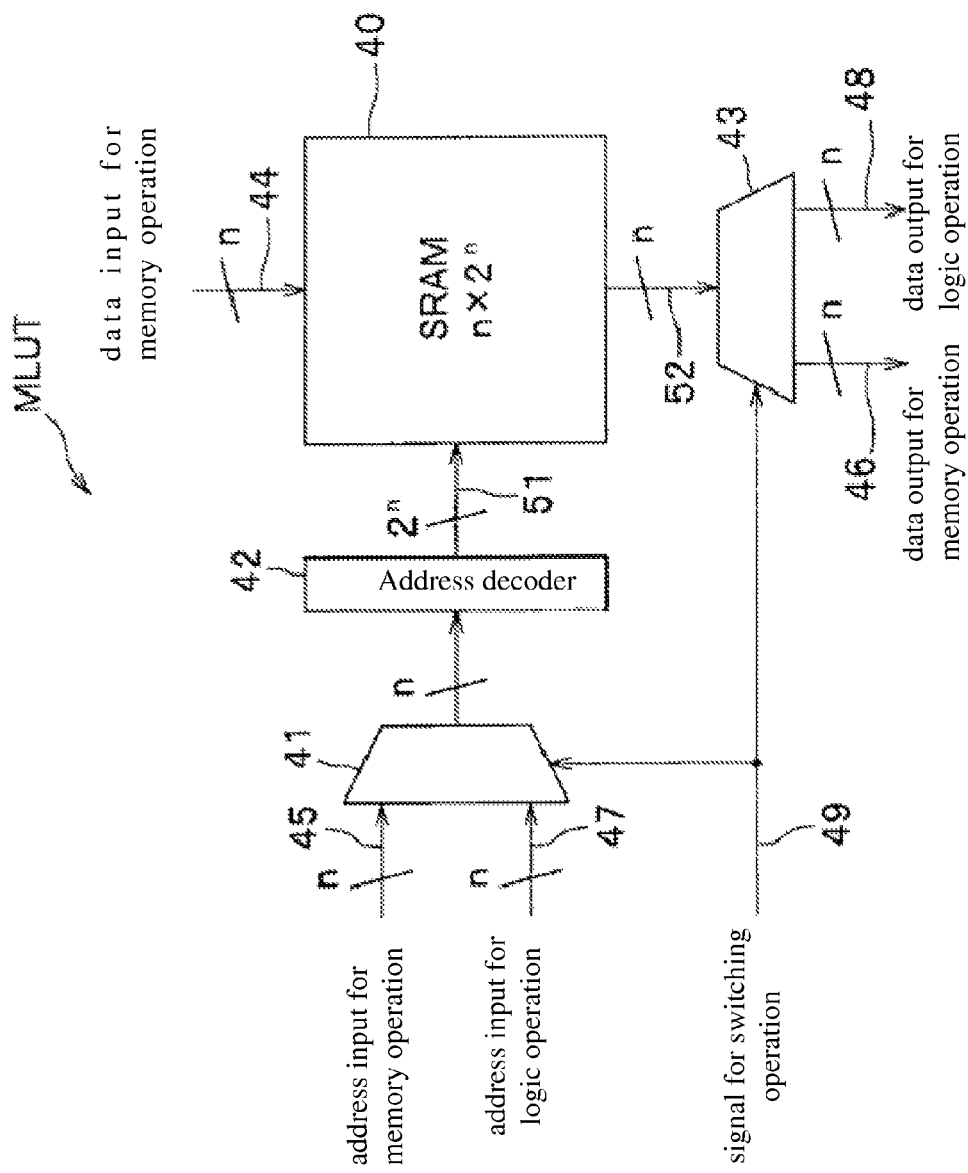

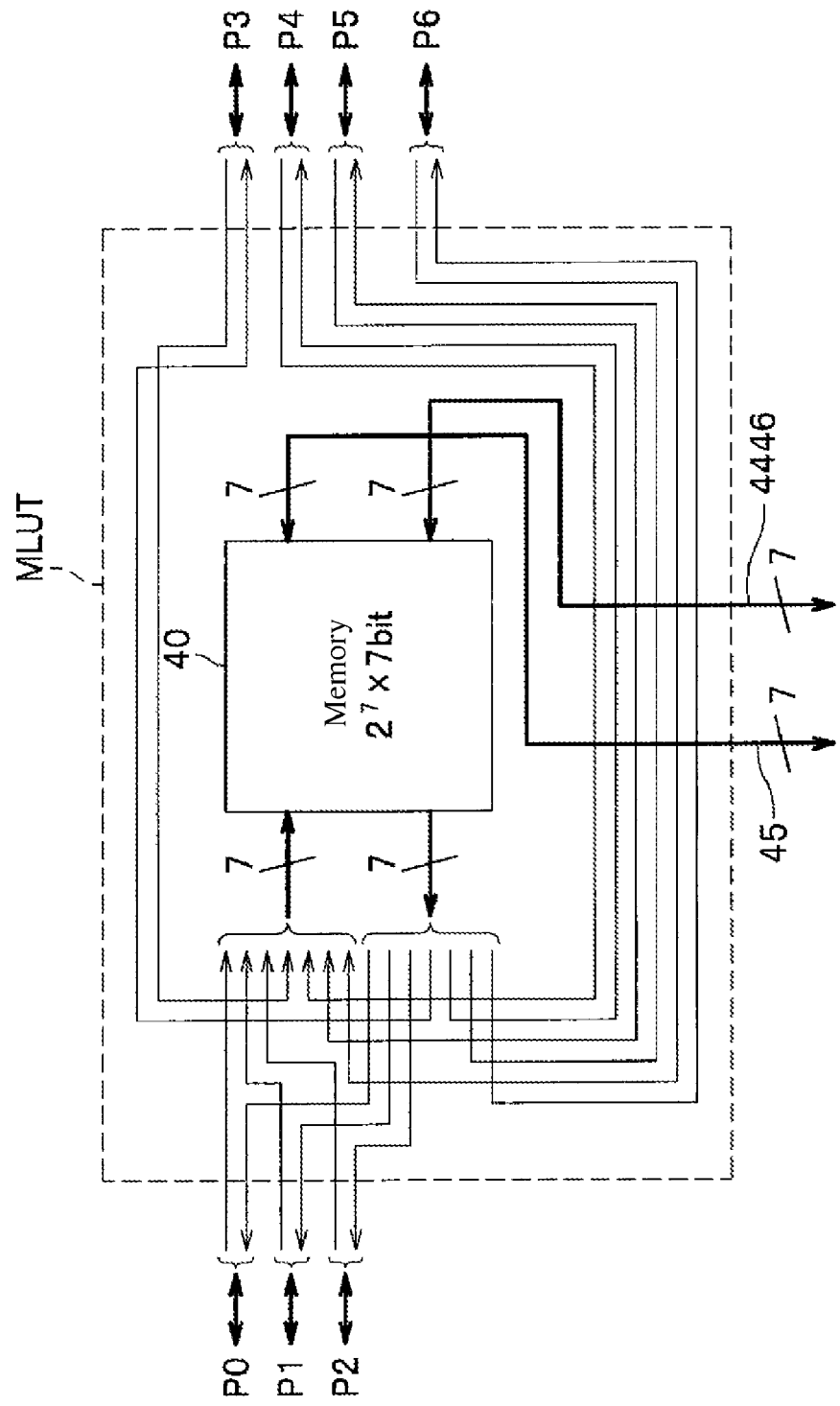
[Fig. 5]

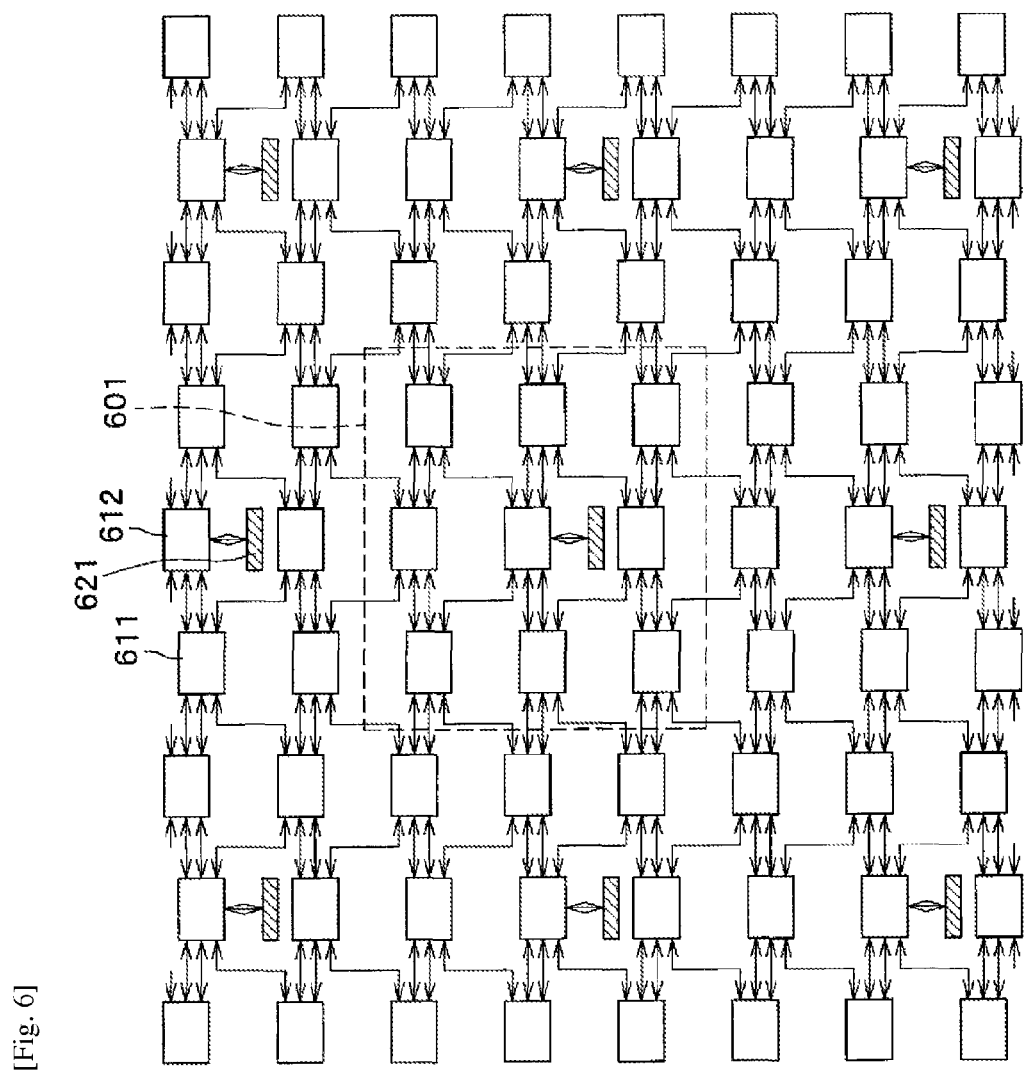
[Fig. 6]

[Fig. 7]
(a)
| INPUTS | | | OUTPUTS | |
|---|---|---|---|---|
| A | B | C | S | Ca |
| 0 | 0 | 0 | 0 | 0 |
| 1 | 0 | 0 | 1 | 0 |
| 0 | 1 | 0 | 1 | 0 |
| 1 | 1 | 0 | 0 | 1 |
| 0 | 0 | 1 | 1 | 0 |
| 1 | 0 | 1 | 0 | 1 |
| 0 | 1 | 1 | 0 | 1 |
| 1 | 1 | 1 | 1 | 1 |
$$\begin{bmatrix} \text{A: Operand} & \text{C: Carry from the lower bit} \\ \text{B: Operator} & \text{S: Sum obtained by calculation} \\ \text{Ca: Carry} & \end{bmatrix}$$
(b)
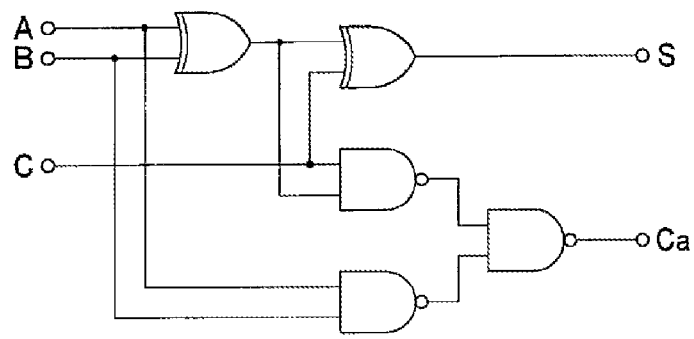

[Fig. 8]
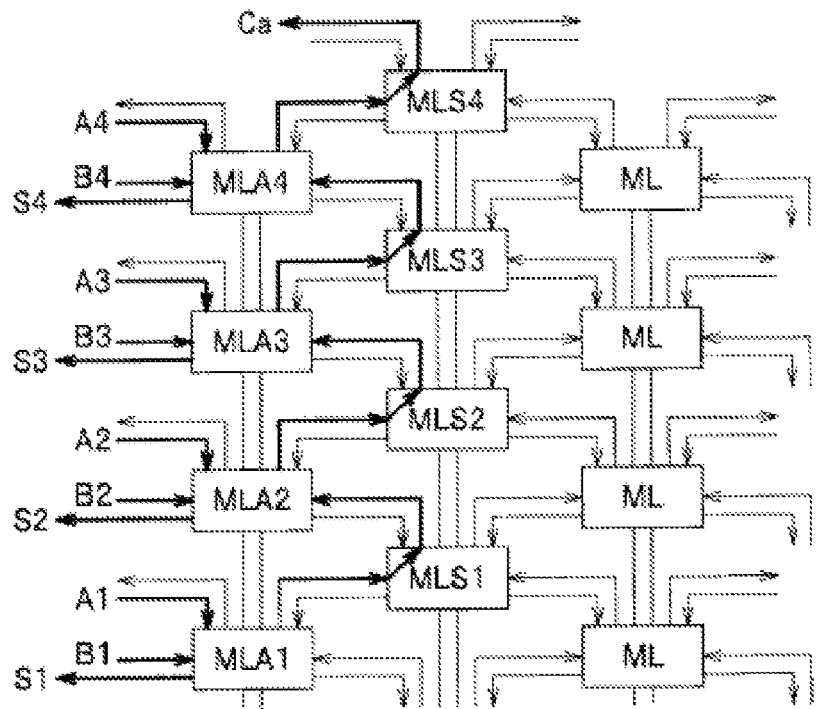
[Fig. 9]
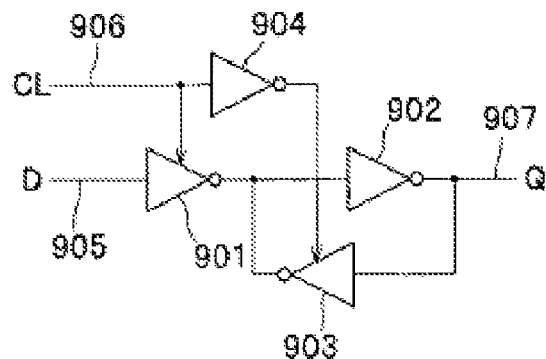
[Fig. 10]
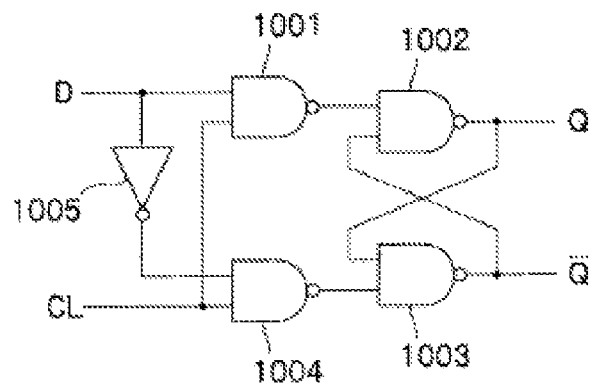

[Fig. 11]
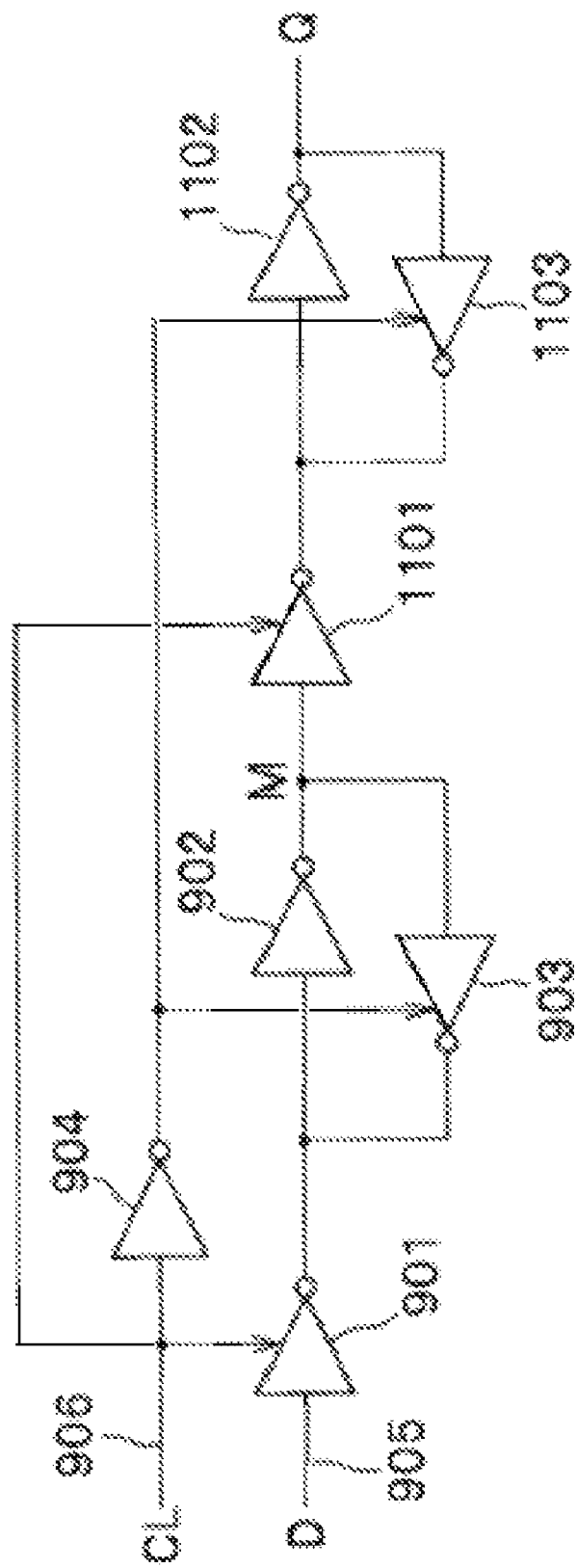

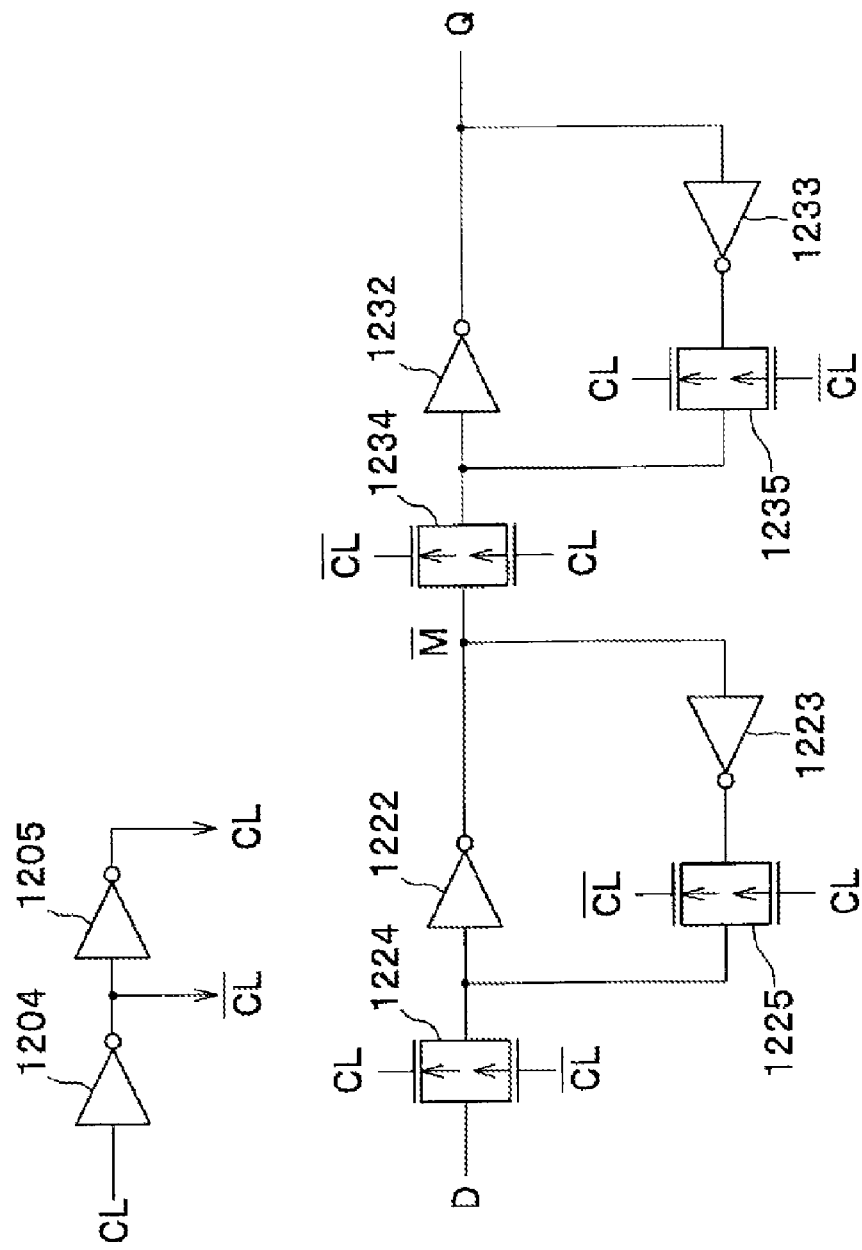
[Fig. 12]

[Fig. 13]
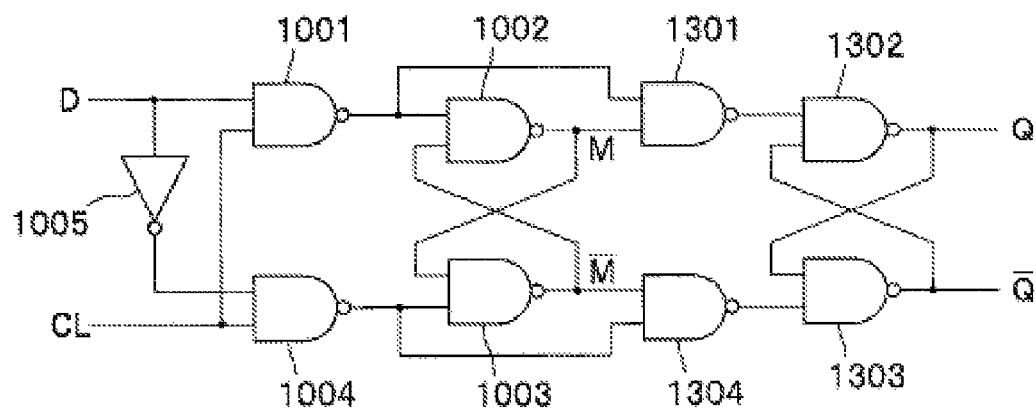
[Fig. 14]
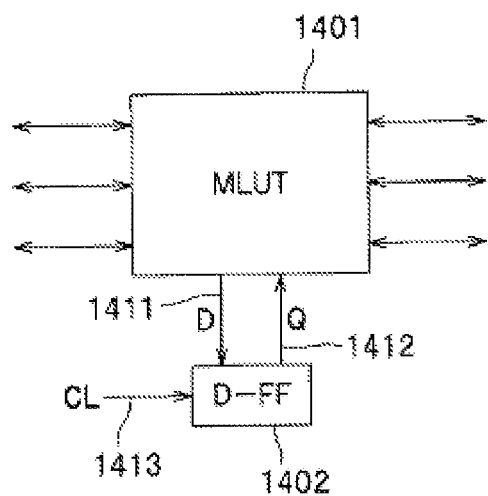

[Fig. 15]
(a)
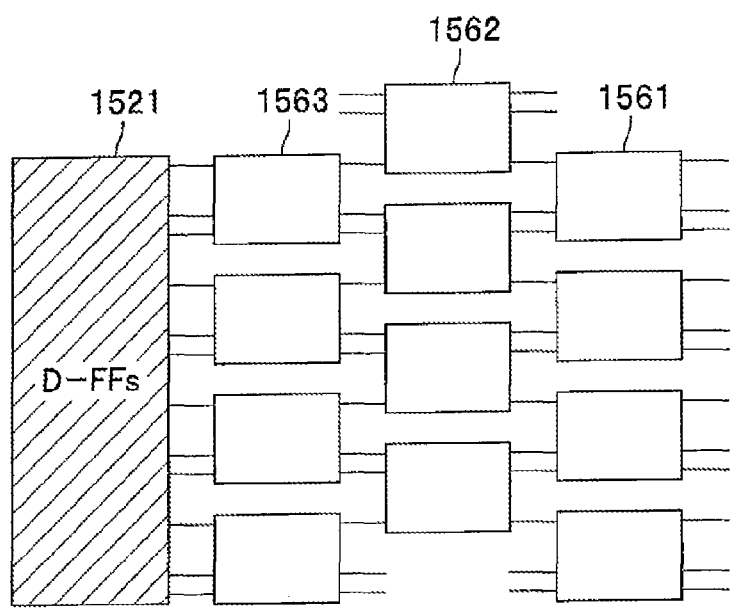
(b)
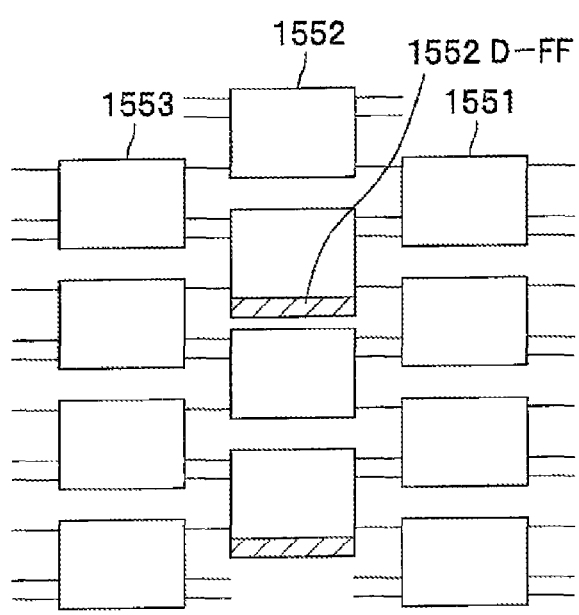

[Fig. 16]
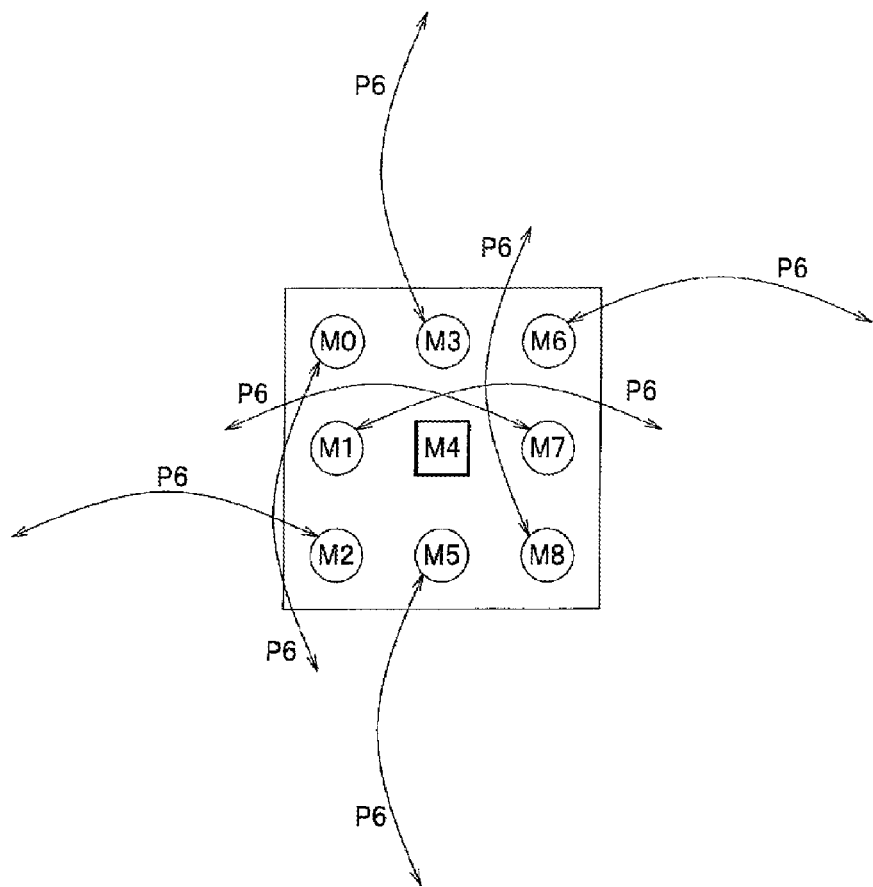

[Fig. 17]
(a)
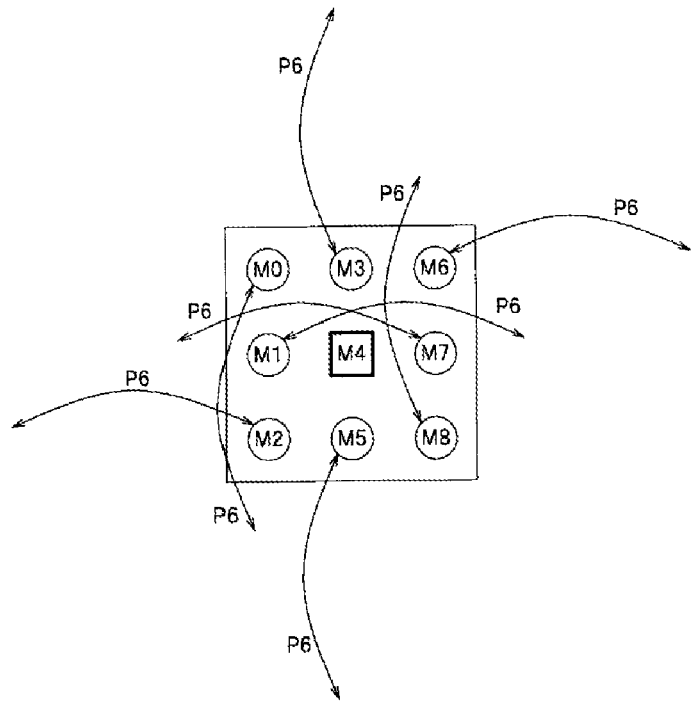
(b)
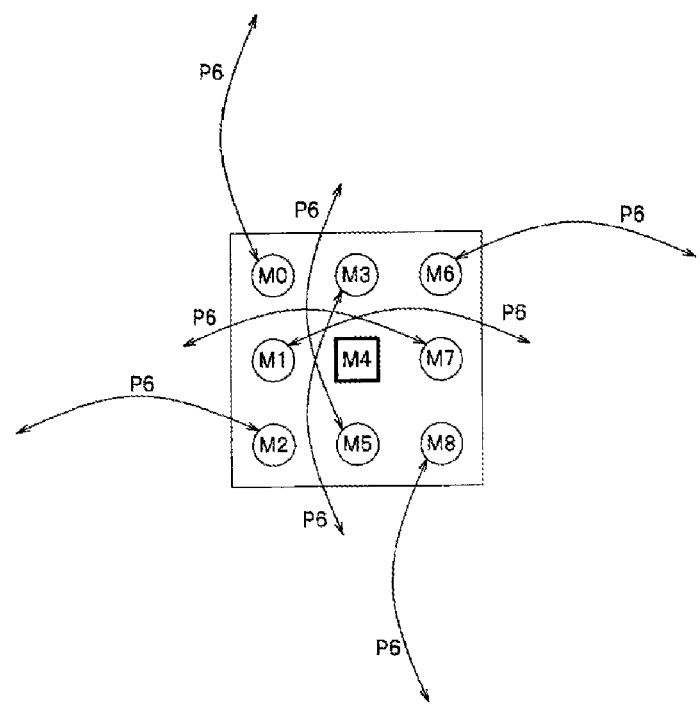

[Fig. 18]
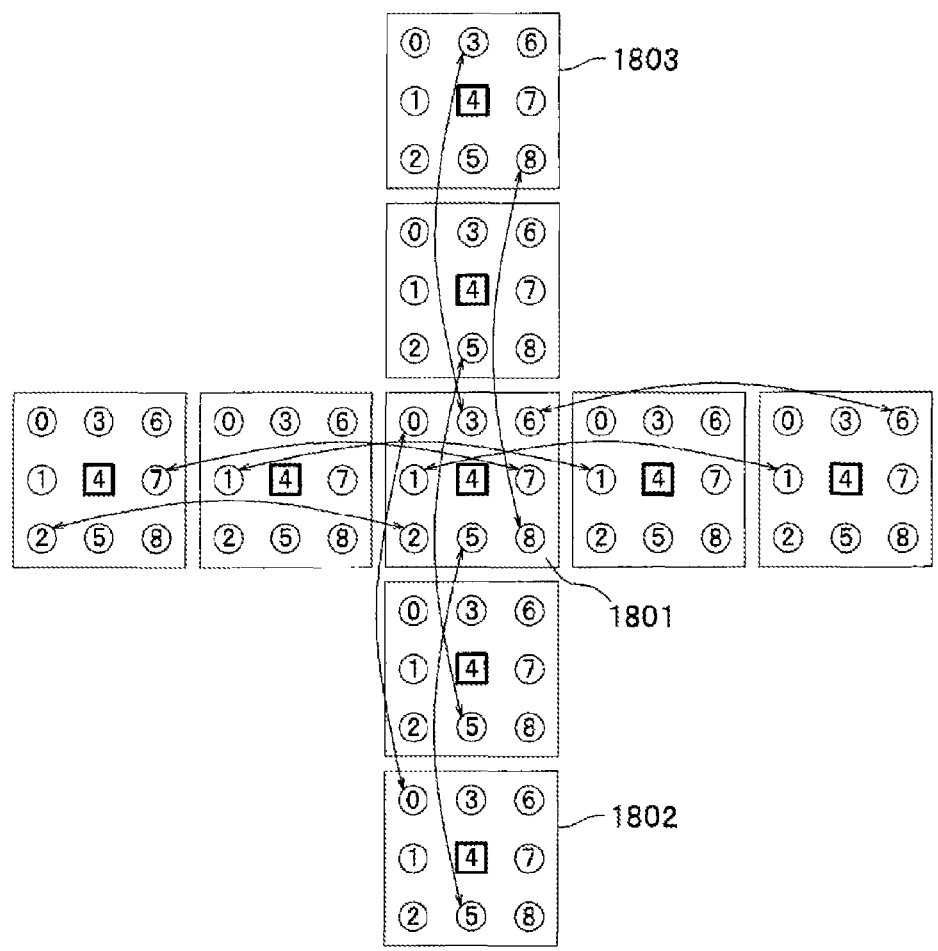

[Fig. 19]
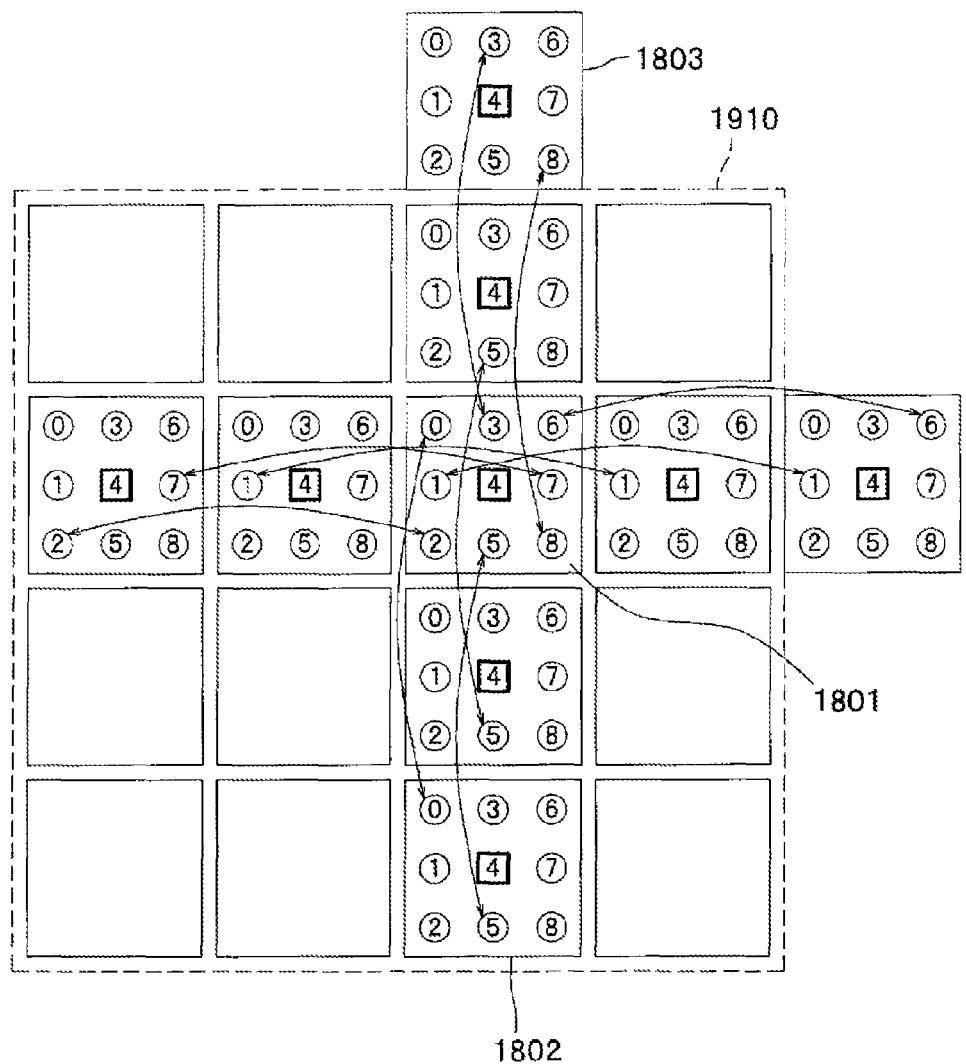

[Fig. 20]
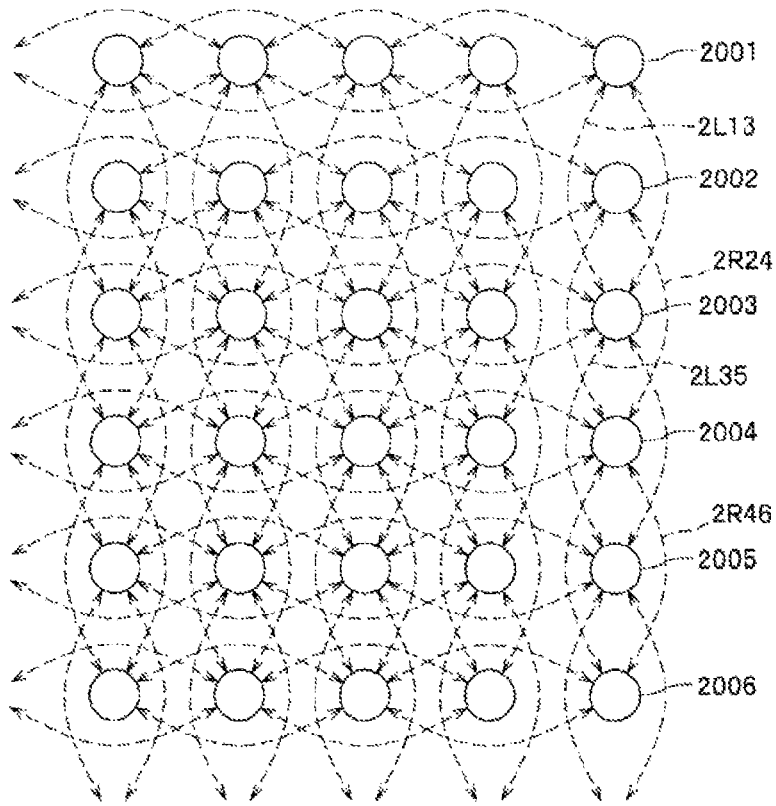
[Fig. 21] Background Art
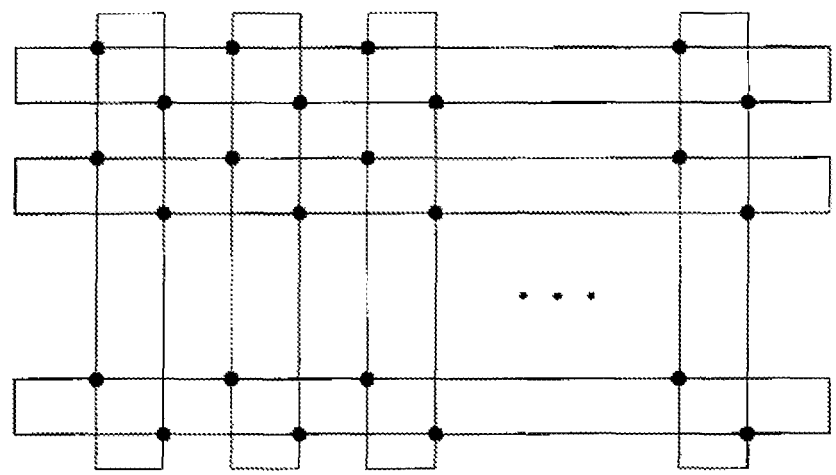

[Fig. 22] Background Art
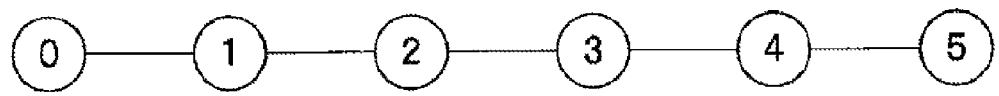
[Fig. 23] Background Art
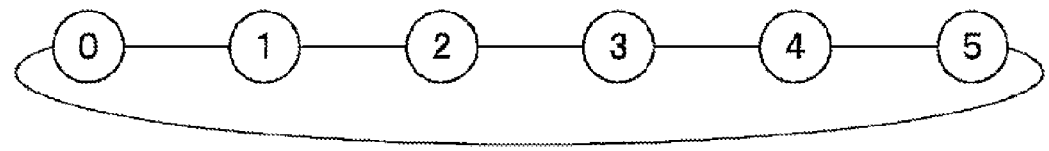
[Fig. 24] Background Art
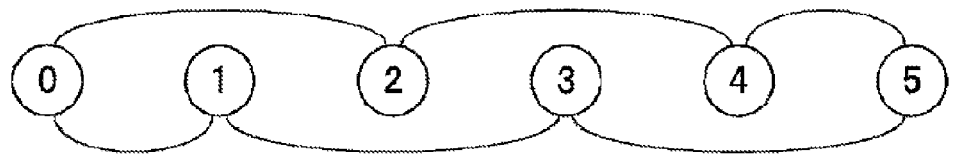

SEMICONDUCTOR DEVICE

This application is the U.S. National Phase under 35 U.S.C. §371 of International Application PCT/JP2010/055029, filed on Mar. 24, 2010, which claims priority to Japanese Patent Application No. 2009-083786, filed on Mar. 30, 2009. The International Applicartion was published under PCT Article 21(2) in a language other than English.

TECHNICAL FIELD

The present invention relates to the configuration of a programmable semiconductor device comprised of logic function cells, each comprising a memory and pairs of address wires and data wires.

BACKGROUND ART

Conventional semiconductor devices equipped with LSI (Large Scale Integration) integrated circuits are generally manufactured in a large quantity to have the same function based on function design, logic design, etc. These devices are suitable for mass production in that they can be produced efficiently at low cost, but they are unusable if functions are different, even slightly. For this reason, conventional semiconductor devices are not suitable for products having multiple varieties each produced in a small quantity, or products requiring frequent specification change or function change.

In light of the above, semiconductor devices that are programmable to allow the customer to set functions or change functions while in operation, have been developed.

One representative example of a programmable semiconductor device is a FPGA (Field Programmable Gate Array) having variable-function circuit cells, variable-signal lines, switch elements, and memory, wherein the aforementioned switches are turned on/off by transistors based on information in the memory to switch the variable-function circuit cells and variable-signal lines to achieve circuits for desired functions in a programmable manner.

However, conventional FPGAs use transistors to switch respective circuits and signal lines, and because the area occupied by each circuit or wiring is fixed, the degree of freedom is limited and their configuration may turn out to be very inefficient depending on the desired function circuit. Because of this, conventional FPGAs generally have poor efficiency per area of the layout, require LSIs of relatively large chip area, and consequently their cost performance is low. These FPGAs also present a problem of high manufacturing cost because their manufacturing process is long and complex due to the large number of wiring layers, etc. In addition, conventional FPGAs generate a problematic transmission delay due to parasitic capacitance and parasitic resistance if the wires connecting each circuit are positioned far away, leading to a possible malfunction in some cases. Or, to avoid this problem of transmission delay, many stages of buffers must be provided in the middle of signal lines, which lead to lower use efficiency of elements, increased chip area and other major problems as the number of long signal lines increases.

Refer to Patent Literature 1 and Patent Literature 2 for patent literatures relating to these FPGAs.

The aforementioned background has led to the development of early MPLD described below. This MPLD has the following configuration:

To be specific, this MPLD uses as the unit cell a MLUT which is equipped with a memory having the same number of address wires and data wires, and has a function that writes data needed to form desired functions to the memory and read, during logic operations, output data corresponding to these logic circuit operations from the memory based on address data corresponding to input signals, wherein a multiple number of the aforementioned MLUT unit cells are arranged side by side and wired with each other to serve as elements that provide functions equivalent to various circuits.

Here, MPLD stands for "Memory-based Programmable Logic Device," while MLUT stands for "MPLD Look Up Table." Refer to Patent Literature 3 and Non-patent Literature 1 for prior art literatures relating to MPLDs and MLUTs.
Background Art Literatures
Patent Literatures
Patent Literature 1: Japanese Patent Laid-open No. 2000-36738
Patent Literature 2: Japanese Patent Laid-open No. 2002-164780
Patent Literature 3: WO 2007/060738 Specification
Non-patent Literatures
Non-patent Literature 1: ITC-CSCC 2008 (The 23rd International Technical Conference on Circuits/Systems, Computers and Communications), pp. 557-560, "Low Cost PLD with High Speed Partial Reconfiguration," Naoki Hirakawa, Masayuki Sato, Kazuya Tanigawa, and Tetsuo Hironaka.

SUMMARY OF THE INVENTION

Problems to Be Solved by the Invention

With conventional MPLDs, however, any flip-flop that is to be used must be placed outside the MPLD, resulting in inefficient line connection between the flip-flop and MLUT. Conventional MPLDs also present other problems such as long connection wirings, large delays, and not supporting higher speeds, among others.

If a conventional MPLD requires a flip-flop or latch circuit, sometimes a MLUT is diverted as a circuit element resource to constitute a flip-flop or latch circuit, after which this circuit is used to constitute a logic circuit requiring flip-flop. However, this approach results in poor area efficiency and element efficiency.

If a synchronous circuit is constituted that controls timings based on reference signals, on the other hand, efficiency of line connection between MLUTs becomes poor and long wirings are required, and consequently large delays occur, higher speed cannot be supported, and other problems occur.

Conventional MPLDs often present the aforementioned problems when a sequential circuit or other circuit where the previous state affects the logic function, or a synchronous circuit that controls timings based on reference signals, is constituted.

To solve the aforementioned problems, it is the object of the present invention to provide a programmable semiconductor device offering high function, stable characteristics, high degree of design freedom, good chip area efficiency, and consequently high cost performance, as well as a semiconductor device constituted by a MPLD that has been modified to address the aforementioned problems.
Means for Solving the Problems To solve the aforementioned object and achieve the purpose of the present invention, each invention is constituted as follows.

The first invention is constituted by a basic unit being a MLUT block constituted by N number (where N is an integer of 1 or greater) of MLUTs each having a memory and pairs of address wires and data wires; wherein a multiple number of these basic units, or MLUT blocks, are arranged and a flip-flop is provided for the MLUT block.

The second invention is the same as the first invention, but where a D-type flip-flop (delayed flip-flop) is used for the aforementioned flip-flop.

The third invention is the same as the first invention, but where two or more flip-flops are provided for each applicable MLUT block.

The fourth invention is the same as the second invention, but where two or more flip-flops are provided for each applicable MLUT block.

The fifth invention is the same as the first invention, but where the aforementioned memory is constituted by SRAM (Static Random Access Memory).

The sixth invention is the same as the first invention, but where the aforementioned memory is constituted by a non-volatile memory.

The seventh invention is the same as the first invention, but where adjacent line between the MLUTs by pairs of address wires and data wires are based on alternated adjacent line.

The eighth invention is the same as the second invention, but where adjacent line between the MLUTs by pairs of address wires and data wires are based on alternated adjacent line.

The ninth invention is the same as any one of the first through fourth inventions, seventh invention, or eighth invention, but where dedicated distant line are used for signal connection between MLUTs or MLUT blocks.

The tenth invention is the same as the ninth invention, but where the distant line include a torus structure.

Effects of the Invention

Thus, according to the aforementioned configurations, the present invention makes it easier to constitute circuits demonstrating higher speed and higher function compared to conventional MPLDs, because a dedicated flip-flop is provided for each applicable MLUT block, sequential circuits can be constituted in addition to combined circuits, and control of synchronization can be achieved easily.

The present invention also improves area efficiency and element efficiency, and thus can be provided at lower cost.

BRIEF DESCRIPTION OF THE DRAWINGS

[FIG. 1] is a circuit block diagram showing the layout of each MLUT in a MLUT block and the relationship of adjacent line between MLUTs pertaining to an example of the present invention.

[FIG. 2] is a wiring pattern diagram showing two types of adjacent line patterns between MLUTs that are wired alternately, for a MLUT block pertaining to an example of the present invention.

[FIG. 3] is a circuit block diagram showing the arrangement of signal wire terminals of pairs of address and data wires in a different example of the present invention.

[FIG. 4] is a circuit block diagram showing the circuit configuration of a MLUT pertaining to an example of the present invention.

[FIG. 5] is a circuit block diagram showing the configuration of multiple pairs of address wires and data wires, as well as input address wires and output data wires used for memory operations, of a MLUT pertaining to an example of the present invention.

[FIG. 6] is a circuit block diagram showing the relationship of MLUTs, flip-flops and adjacent line in an orderly planar arrangement of MLUT blocks pertaining to an example of the present invention.

[FIG. 7] is a function diagram indicating the operating function of a conventional full adder, and circuit diagram showing an example of circuit configuration.

[FIG. 8] is a circuit block diagram showing the configuration of a 4-bit addition circuit using MLUTs pertaining to an example of the present invention.

[FIG. 9] is a circuit diagram showing the first example of a D-type flip-flop used in examples of the present invention and prior art.

[FIG. 10] is a circuit diagram showing the second example of a D-type flip-flop used in examples of the present invention and prior art.

[FIG. 11] is a circuit diagram showing the third example of a D-type flip-flop used in examples of the present invention and prior art.

[FIG. 12] is a circuit diagram showing the fourth example of a D-type flip-flop used in examples of the present invention and prior art.

[FIG. 13] is a circuit diagram showing the fifth example of a D-type flip-flop used in examples of the present invention and prior art.

[FIG. 14] is a circuit block diagram indicating the connection relationship of a MLUT and D-type flip-flop pertaining to an example of the present invention.

[FIG. 15] is a layout block diagram indicating the layout relationship of MLUTs and D-type flip-flop pertaining to an example of the present invention.

[FIG. 16] is a wiring diagram showing the connection of distant line from each MLUT in a MLUT block pertaining to an example of the present invention.

[FIG. 17] is a wiring diagram showing two types of connection patterns for distant line from each MLUT in a MLUT block pertaining to an example of the present invention.

[FIG. 18] is a wiring diagram showing the connection of distant line between MLUT blocks and MLUTs pertaining to an example of the present invention.

[FIG. 19] is a block layout drawing showing the configuration of MLUT blocks for efficient design layout of MLUT blocks and MLUTs pertaining to an example of the present invention.

[FIG. 20] is a wiring diagram showing the distant line, by torus interconnect (network), of MLUT blocks pertaining to an example of the present invention.

[FIG. 21] is an overly simplified wiring diagram showing a torus interconnect and torus interconnect network which is defined in the present disclosure and finds use in examples of the present invention and prior art.

[FIG. 22] is an overly simplified wiring diagram showing the first example of signal line finding use in an example of prior art.

[FIG. 23] is an overly simplified wiring diagram showing the second example of signal line finding use in an example of prior art.

[FIG. 24] is an overly simplified wiring diagram showing a torus interconnect which is defined in the present disclosure and finds use in examples of the present invention and prior art.

MODE FOR CARRYING OUT THE INVENTION

The mode for carrying out the present invention is explained below by referring to drawings.

(Embodiments of MLUT Blocks Constituting Semiconductor Devices Conforming to Present Invention)

FIG. 1 is a circuit block diagram showing the first example of configuration of a MLUT block having nine MLUTs, which is a key element of a semiconductor device conforming to the present invention.

In FIG. 1, M0 to M8 are MLUTs. A MLUT block is constituted by MLUTs M0 to M8. MLUTs M0 to M8 constitute a circuit by exchanging signals via pairs of address wires and data wires (may be abbreviated as "address-data pairs" hereinafter) between adjacent MLUTs on a same plane. Interconnects between adjacent MLUTs on a same plane are called adjacent line. On the other hand, interconnects between non-adjacent MLUTs on a same plane are called distant line.

In FIG. 1, only adjacent line via pairs of address wires and data wires characterizing the present invention are illustrated using reference numerals and other wirings are not illustrated to avoid confusion. Signal lines not illustrated in FIG. 1 will be explained later using FIGS. 4 and 5. Also note that a D-type (delayed) flip-flop is attached to MLUT M4. A D-type flip-flop is sometimes abbreviated as "D-FF" in drawings. To explain the function pertaining to FIG. 1, the configuration of the MLUT itself, which constitutes MLUTs M0 to M8, is important. Accordingly, the MLUT is explained first.

(MLUT)

FIG. 4 is a circuit block diagram showing the specific configuration of a MLUT which is a basic circuit unit constituting a semiconductor device conforming to the present invention. This configuration, and operation, are explained below.

In FIG. 4, a memory block 40 is constituted by n×($2^n$) (n is a positive integer) of memory cells that are SRAMs (Static Random Access Memories) arranged in a matrix pattern. The memory block 40 also has ($2^n$) number of address wires 51, n number of data inputs for memory operation 44, and also n number of data outputs for memory operation 52.

Now, data of expected values to achieve a circuit function are input to this memory block 40 according to the procedure explained below. An input signal for switching operation 49 is used as a memory operation signal. When this signal is received, address inputs for memory operation (n number) 45 are loaded from an address switching circuit 41, and an address decoder 42 is used to specify addresses from among those in the number of $2^n$, to activate only n number of SRAM cells in the memory block 40 in one row corresponding to the aforementioned addresses, and n number of data of expected values needed for these addresses are stored in the SRAM cells in this row, from data inputs for memory operation 44, via n number of signal wires. Next, different addresses are loaded from address inputs for memory operation 45, and the address decoder 42 is used to specify different addresses from among those in the number of $2^n$, to activate only n number of SRAM cells in one row, after which data of different expected values needed for these addresses are stored in the SRAM cells in this row, from data inputs for memory operation 44, via n number of signal wires. This way, expected values of the function circuit are written sequentially to n×($2^n$) number of SRAM cells. When done, the write procedure is complete. Note that a group of data written to the memory block 40 consists of output values expected from the MLUT as a specified circuit, in response to input values (addresses).

Next, to have the MLUT operate as a circuit, a signal for switching operation 49 is used to select logic operation. When this signal is received, address inputs for logic operation (n number) 47 are loaded from the address switching circuit 41 and only n number of SRAM cells corresponding to the desired addresses selected via the address decoder 42 are activated, after which n number of data is retrieved to data wires (n number) 52 of the memory block 40 and retrieved, as output data, to data outputs for logic operation (n number) 48 via an output data switching circuit 43. This output data, consisting of output values expected from the desired logic circuit in response to input values, functions as an equivalent of the logic circuit. Note that if the address of the input value changes, a different output value is obtained for that input value. This way, operations equivalent to those of the desired logic circuit are achieved for specified input values.

The foregoing explained how the MLUT can operate as a logic circuit, but the MLUT can also be used as a simple memory circuit. In this case, a signal for switching operation 49 is used to select memory operation, and addresses are selected sequentially from address inputs for memory operation 45 to activate n number of SRAM cells in the memory block 40 via the address decoder 42, and write n number of data from data inputs for memory operation 44. When all addresses have been written this way, the write operation is complete.

Next, to read data of this memory circuit from the memory block 40, a signal for switching operation 49 is used to select memory operation. When this signal is received, address inputs for memory operation 45 are loaded from the address switching circuit 41 and only n number of SRAM cells corresponding to desired addresses 51 selected via the address decoder 42 are activated, after which n number of data is retrieved to data wires 52 of the memory block 40 and retrieved, as output data, to data outputs for memory operation (n number) 46 via the output data switching circuit 43. This operation provides a memory cell output for each input address, indicating that the MLUT is functioning as a general memory circuit.

Note that data inputs for memory operation 44 and data outputs for memory operation 46 are never used at the same time, so the same bi-directional I/O line may be used for both purposes.

As explained above, the MLUT can be assigned a function of either a logic circuit or memory circuit.

Take note that, if the memory block 40 is constituted by SRAMs, the memory data will be lost once the power is cut off. When the power is subsequently turned on, data must be rewritten to the memory block 40 first, before desired circuit operations can be achieved.

FIG. 5 is a circuit block diagram showing a wiring configuration that further clarifies the relationship of the internal configuration of the MLUT in FIG. 4 and connection relationship of adjacent line of MLUTs in FIG. 1. In FIG. 5, the memory block 40 and address inputs for memory operation 45 correspond to the memory block 40 and address inputs for memory operation 45 in FIG. 4, respectively. A memory operation I/O data 4446 in FIG. 5 corresponds to bi-directional data combining the data inputs for memory operation 44 and data outputs for memory operation 46 in FIG. 4. In FIG. 5, address-data pairs P0 to P6, each combining two signal wires, correspond to seven wires of address input for logic operation 47 and seven wires of data outputs for logic operation 48 (n=7) in FIG. 4, where these individual wires are used to reconstitute seven pairs of input address wires and data output wires in FIG. 5. Note that in FIG. 5, the address switching circuit 41, address decoder 42, output data switching circuit 43, and signal for switching operation 49, are not illustrated to avoid confusion both graphically and in comprehension.

(MLUT Block)

Among the address-data pairs P0 to P6 reconstituted by address inputs for logic operation and data outputs for logic operation in FIG. 5, address-data pairs P0 to P5 correspond to address-data pairs P0 to P5 in FIG. 1. In FIG. 1, address-data pairs P0 to P5 are represented by one wire, but they are actually constituted by two wires as shown in FIG. 5, or specifically an address wire and a data wire, combined as a pair. The remaining address-data pair P6 in FIG. 5 is used for distant line, which is not illustrated in FIG. 1. In FIG. 1, MLUTs M0 to M8 are each constituted by the aforementioned MLUT, and have various circuit functions according to data written to the memory block of the MLUT. These MLUTs M0 to M8 are interconnected by address-data pairs P0 to P5 representing adjacent line, and since addresses correspond to input signals and data wires correspond to output signals, the individual function circuits are combined to constitute a more complex circuit.

Note that MLUT M4 has a D-type flip-flop 11 provided for it. Signal line connection of this D-type flip-flop 11 and MLUT M4 uses address-data pair P6 not used for adjacent line. Since MLUT M4 uses address-data pair P6 for its connection with the D-type flip-flop 11, distant line is not used only in MLUT M4. In FIG. 1, MLUTs M0 to M3 and MLUTs M5 to M8 have no D-type flip-flop, but have distant line terminals instead, to support distant line via the remaining address-data pair P6 in FIG. 5 to exchange signals to/from circuits located relatively far away.

In FIG. 1, the directions of address-data pairs P0 to P5 are vertically/laterally reversed between MLUT M0 and MLUT M3. Other MLUTs also have two types of patterns, as shown in FIG. 2. In FIG. 2, the first type of MLUT, represented by M0, has its address-data pairs P1, P2 located on the left side, while address-data pairs P3, P4 are located on the right side. All these pairs are used for adjacent line with MLUTs positioned in lateral directions. In the meantime, address-data pair P0 is positioned at the bottom left, while address-data pair P5 is positioned at the bottom right, and both are used for adjacent line with MLUTs positioned to the left and right in the lower level. This is the layout of address-data pairs of the first type of MLUT.

Also, the second type of MLUT, represented by M3, has its address-data pairs P1, P2 located on the right side, while address-data pairs P3, P4 are located on the left side. All these pairs are used for adjacent line with MLUTs positioned in lateral directions. In the meantime, address-data pair P0 is positioned at the top right, while address-data pair P5 is positioned at the top left, and both are used for adjacent line with MLUTs positioned to the right and left in the upper level. This is the layout of address-data pairs of the second type of MLUT.

In other words, the first type of MLUT represented by M0 and second type of MLUT represented by M3 have vertically and laterally symmetrical layout patterns of address data pairs used for adjacent line, which can provide efficient adjacent line connection of address-data pairs between adjacent MLUTs, as shown in FIG. 1. This layout shown in FIG. 2, where two types of MLUTs having laterally and vertically symmetrical positions of address-data pairs are arranged alternately in one direction and connected by adjacent line of address-data pairs accordingly, is called alternated adjacent line.

In the above, in FIG. 1 the aforementioned alternated adjacent line based on two types of MLUTs is given as an example of efficient layout and wiring, but address-data pairs are not provided in vertical directions for MLUTs M0, M1 and M2 in FIG. 1. Naturally, various other MLUT layouts and address-data pair layouts with address-data pairs provided in vertical directions are also possible. Although not illustrated in FIG. 1, however, in reality in addition to address-data pairs P0 to P5 used for adjacent line, there are other wirings such as address-data pair P6 used for distant line, address inputs for memory operation 45, and memory operation I/O data 4446, as in FIG. 5 showing the internal configuration of a MLUT. These wirings not illustrated in FIG. 1 are mainly provided in vertical directions in FIG. 1.

Accordingly, use of adjacent line in vertical directions does not necessarily provide efficient layout and wiring, when wirings provided in vertical directions other than adjacent line, such as the aforementioned address-data pair P6 for distant line, address inputs for memory operation 45 and memory operation I/O data 4446, are considered. In other words, when wirings other than the aforementioned adjacent line provided in vertical directions are considered, the aforementioned alternated adjacent line shown in FIG. 1 presents an excellent example of adjacent line configuration.

As for the aforementioned alternated adjacent line, two types of MLUT layouts are available: One is where two types of laterally and vertically symmetrical MLUTs are arranged in a layout pattern of transistors and other elements, and the other is where two types of laterally and vertically symmetrical MLUT wiring constituted only by wiring layers constituted mainly of the adjacent line layers of address-data pairs.

(Multiple MLUT Blocks)

FIG. 6 shows a condition where MLUT blocks, each constituted by nine MLUTs as shown in FIG. 1, are arranged repeatedly. In FIG. 6, an area enclosed by a broken line 601 represents the MLUT block shown in FIG. 1. As can be seen, MLUTs 611, 612 and flip-flop 621 are also arranged in an orderly manner outside the MLUTs enclosed by the broken line 601.

In FIG. 6, only adjacent line by address-data pairs are shown, and distant line, MLUT control wirings, etc., are not shown, to simplify the illustration. These multiple MLUT blocks are combined to constitute circuits having desired functions. Multiple units of these MLUT blocks form a semiconductor device.

Note that while FIG. 1 shows a condition where MLUTs M0 to M8 are arranged orderly in a grid pattern, FIG. 6 shows a condition where MLUTs M0 to M8 are arranged in a cluster-like pattern, roughly corresponding to the apexes of lozenges. The purpose of FIG. 1 is to provide a clear picture of the position relationship of adjacent line, while the purpose of FIG. 6 is to show the presence of D-type flip-flops, and in an actual layout pattern these MLUTs can be arranged in a square or rectangle, grid pattern or cluster of lozenges.

(Configuration Example of Circuit Function)

FIG. 8 gives an example of realizing a 4-bit adder using a group of MLUT blocks.

(Configuration of 1-bit Full adder)

First, FIG. 7(a) shows the truth values of a 1-bit full adder. In FIG. 7, A is an operand, B is an operator, C is a carry from the lower bit, S is a result of addition, and Ca is a carry to the higher bit. This figure shows what happens to the calculation result S and the carry to the higher bit Ca depending on a combination of the operand A and operator B being two input values for addition, and on the presence or absence of C being a carry from the lower bit.

FIG. 7(b) gives an example of a standard circuit that realizes the above relationship of truth values. FIG. 7(b) is a well-known general circuit configuration, so it is not explained in detail.

Assuming one MLUT having the structure shown in FIG. 4, first inputs A, B and C in FIG. 7(a) are assigned to address inputs for memory operation 45, while outputs S and Ca are assigned to data inputs for memory operation 44, after which each combination of inputs A, B and C is input to address inputs for memory operation 45, and the values of outputs S and Ca corresponding to this combination are written to the 2-bit SRAMS cells that have been specified by the addresses and activated, via data inputs for memory operation 44. Once this data is written, the MLUT has a function as a 1-bit full adder. from data outputs for logic operation 48. Note that the logic input addresses 47 and data outputs for logic operation 48 are included in six address-data pairs P0 to P5, as shown in FIGS. 1 and 5, and can serve Next, a desired combination of inputs A, B and C in FIG. 7(a) is input from logic input addresses 47 shown in FIG. 4, and the values of outputs S and Ca as a full adder will be output as adjacent line to permit exchange of I/O signals with multiple adjacent MLUTs.

(4-bit Addition Circuit Using MLUTs)

FIG. 8 is a circuit block diagram showing a 4-bit addition circuit configured in a group of MLUT blocks. In FIG. 8, MLA1, MLA2, MLA3 and MLA4 are each a MLUT that has been given the function of a 1-bit full adder by the method explained above. On the other hand, MLS1, MLS2, MLS3 and MLS4 are each a MLUT having a function to make the input and output values identical, and are given a function corresponding to the condition when the switch is turned on.

To MLA1 having the function of a full adder, input signals A1 and B1 corresponding to the operand and operator of bit 1 are input from input addresses of input address-data pairs. The calculation result of bit 1 is output, as S1, from an output data of an input-address data pair.

To MLA2 having the function of a full adder, input signals A2 and B2 corresponding to the operand and operator of bit 2 are input from input addresses of input address-data pairs. The calculation result of bit 2 is output, as S2, from an output data of an input-address data pair.

To MLA3 having the function of a full adder, input signals A3 and B3 corresponding to the operand and operator of bit 3 are input from input addresses of input address-data pairs. The calculation result of bit 3 is output, as S3, from an output data of an input-address data pair.

To MLA4 having the function of a full adder, input signals A4 and B4 corresponding to the operand and operator of bit 4 are input from input addresses of input address-data pairs. The calculation result of bit 4 is output, as S4, from an output data of an input-address data pair.

MLS 1 having a wiring switch function inputs Ca, being a carry to the higher bit, from the aforementioned full adder MLA1, and for the output it connects to C, being a carry from the lower bit, of the aforementioned full adder MLA2 via the input address-data pair.

MLS2 having a wiring switch function inputs Ca, being a carry to the higher bit, from the aforementioned full adder MLA2, and for the output it connects to C, being a carry from the lower bit, of the aforementioned full adder MLA3 via the input address-data pair.

MLS3 having a wiring switch function inputs Ca, being a carry to the higher bit, from the aforementioned full adder MLA3, and for the output it connects to C, being a carry from the lower bit, of the aforementioned full adder MLA4 via the input address-data pair.

MLS4 having a wiring switch function inputs Ca, being a carry to the higher bit, from the aforementioned full adder MLA4, and outputs a carry of the 4-bit adder.

As explained above, this circuit configuration uses input signals including four operand bits (A1, A2, A3, A4) and four operator bits (B1, B2, B3, B4) to obtain calculation results (S1, S2, S3, S4) and carry output signal Ca.

(Flip-Flop Circuit)

The foregoing provided examples of applying the present invention to a 1-bit full adder in FIG. 7, and to a 4-bit addition circuit in FIG. 8. Both are so-called combined circuits that are determined uniquely by the input signals received at a given time. In comparison, a circuit whose output result varies depending on the previous state, even though the input signals are the same, is called a sequential circuit.

A sequential circuit generally requires a latch circuit that stores the previous state, or flip-flop circuit.

Note that, if there are various inputs, even a combined circuit may transiently malfunction or generate an inappropriate output signal due to a delay in, or varying timing of arrival, of each signal input to the function circuit. In this case, an effective method is to use a flip-flop, etc., to synchronize signals.

In the context of the present invention, the D-type flip-flop accompanying M4 in FIG. 1 is used as an example. Also, FIG. 14 is provided as a circuit block diagram showing the connection relationship of MLUT M4 and D-type flip-flop in FIG. 1 in greater detail. In FIG. 14, address-data pair P6 in FIG. 5 is used between MLUT 1401 and D-type flip-flop 1402. P6 is an address-data pair intentionally left for exchange of signals with the D-type flip-flop, unlike address-data pairs P0 to P5 that are used for adjacent line. In FIG. 14, this address-data pair P6 of MLUT 1401 is connected to D terminal 1411 and Q terminal 1412 of the D-type flip-flop 1402. To CL signal terminal 1413 of the D-type flip-flop 1402, a signal used as the reference for synchronization will be selected and connected.

Shown in FIG. 15(a) and (b) are layout block diagrams showing the layout relationship of each MLUT and D-type flip-flop. In FIG. 15(a), multiple MLUTs 1561 to 1563, etc., are arranged, together with a group of D-type flip-flops 1521. Multiple D-type flip-flops are arranged in one location outside the group of MLUTs. In FIG. 15(b), on the other hand, D-type flip-flops 1512, 1513 are arranged over a wide range, in a uniform manner, among the group of MLUTs (1552, 1553, etc.), as shown in FIGS. 1 and 6.

FIG. 15(a) represents a position relationship where D-type flip-flops are distant from each MLUT that uses them, where oftentimes wiring inefficiency and congestion occur and the layout becomes inappropriate. In FIG. 15(b), on the other hand, D-type flip-flops are positioned relatively close to each MLUT and thus can be used efficiently. This shows that the MLUT block configuration shown in FIG. 1 is better.

(Flip-flop Circuit Configuration)

FIG. 9 is a circuit diagram showing the first example of a specific circuit configuration of D-type flip-flops shown in FIGS. 1 and 6. Note that the circuit shown in FIG. 9 is a D-type flip-flop of 1-bit master type. The configuration and operation are explained below.

In FIG. 9, the D-type flip-flop is constituted by inverter circuits 904, 902 and clocked gate inverter circuits 901, 903. A clocked gate inverter circuit is an inverter circuit (inverting circuit) that determines whether or not to output an output signal based on whether the clock signal is 1 or 0.

Here, a clock signal (CL) that controls the operation timing is input to the input terminal of the inverter circuit 904, and a clock-signal bit-inverted signal is output from the output terminal. A data signal (D) to be controlled 905 is input to the input terminal of the clocked gate inverter circuit 901, and a data-signal bit-inverted signal is output from the output terminal. Note that whether or not to output each output signal is controlled by a clock signal (CL) (terminal 906). The input terminal of the inverter circuit 902 is connected to the output terminal of the clocked gate inverter circuit 901, while the output terminal of the inverter circuit 902 is connected to an output terminal (Q) 907 that functions as a D-type flip-flop terminal. The output terminal of the inverter circuit 902 is also connected to the input terminal of the clocked gate inverter circuit 903. The output terminal of the clocked gate inverter circuit 903 is connected to the input terminal of the inverter circuit 902. Note that the output of the clocked gate inverter circuit 903 is connected in such a way that it is controlled by the output signal of the inverter circuit 904, which means that this output is controlled by the clock-signal (CL) bit-inverted signal.

Assume a binary signal whose positive value and negative value are expressed by 1 and 0, respectively. If the clock signal (CL) input from the terminal 906 is 1, the data signal (D) from the D-type flop-flop input signal terminal 905 is inverted by the clocked gate inverter circuit 901, and then inverted again by the inverter circuit 902, whereupon a signal identical to the data signal (D) is output immediately to the D-type flip-flop output signal terminal 907. At this time, a signal identical to the data signal (D) of the output signal terminal 907 is input to the input terminal of the clocked gate inverter circuit 903, but since the output signal from the inverter circuit 904, or namely the clock-signal (CL) bit-inverted signal, has the control, no output signal is output to the output terminal of this clocked gate inverter circuit 903 (a high-impedance state where the signal value is neither 1 nor 0).

Next, when the clock signal (CL) from the terminal 906 changes to 0, no output signal is output to the output terminal of the clocked gate inverter circuit 901. On the other hand, the control signal of the clocked gate inverter circuit 903 becomes 1, and the data-signal (D) bit-inverted signal from the output signal terminal 907 is output to the output terminal of the clocked gate inverter circuit 903. Because of this, the output terminal of the inverter circuit 902 outputs an bit-inverted signal of the data-signal (D) bit-inverted signal, or specifically the data signal (D) and, because this output terminal is also connected to the input terminal of the clocked gate inverter circuit 903, the inverter circuit 902 and clocked gate inverter circuit 903 constitute a latch circuit that stores and retains the data signal (D) in the previous state while the clock signal (CL) is 0. While this clock signal (CL) is 0, the data signal (D) in the previous state is retained and output regardless of how the data of the D-type flip-flop input signal terminal 905 changes. Once the clock signal (CL) becomes 1, this D-type flip-flop outputs a new output signal according to a new data signal (D). Until then, the data signal (D) in the previous state is stored and output continuously. This is the basic operation of the D-type flip-flop of 1-bit master type shown in FIG. 9.

FIG. 11 is a circuit diagram showing the second example of a specific D-type flip-flop circuit configuration. Note that the circuit shown in FIG. 11 is a D-type flip-flop of 1-bit master-slave type.

In FIG. 11, the D-type flip-flop is constituted by a master 1-bit D-type flip-flop which is in turn constituted by inverter circuits 904, 902 and clocked gate inverter circuits 901, 903, and a slave 1-bit D-type flip-flop which is in turn constituted by inverter circuits 904, 1102 and clocked gate inverter circuits 1101, 1103. The configuration of master inverter circuits 904, 902 and clocked gate inverter circuits 901, 903 in FIG. 11 is exactly the same as the configuration of inverter circuits 904, 902 and clocked gate inverter circuits 901, 903 in FIG. 9, where the same reference numerals are assigned to corresponding elements. In other words, the aforementioned master has a function as a 1-bit D-type flip-flop.

Also, the configuration of slave inverter circuits 904, 1102 and clocked gate inverter circuits 1101, 1103 in FIG. 11 is exactly the same as the configuration of master inverter circuits 904, 902 and clocked gate inverter circuits 901, 903 in FIG. 11, where the reference numerals assigned to corresponding elements share the same last digit. In other words, the slave constituted by inverter circuits 904, 1102 and clocked gate inverter circuits 1101, 1103 in FIG. 11 also has a function as a 1-bit D-type flip-flop.

However, the clock signal CL supplied to the clocked gate inverter circuits 1101, 1103 and its bit-inverted signal, have an anti-phase relationship with the clock signal CL supplied to the clocked gate inverter circuits 901, 903 and its bit-inverted signal. Also, the master output, or specifically output terminal M of the inverter 902, is connected to the slave input terminal of the clocked gate inverter circuit 1101. The master output terminal M input to the slave input terminal is output to the output signal of the inverter circuit 1102 as a slave output signal Q, via the slave 1-bit D-type flip-flop.

Accordingly, the master 1-bit D-type flip-flop and slave 1-bit D-type flip-flop in FIG. 11 are combined, but since their operation phases are inverted, these D-type flip-flops function as a 2-bit master-slave D-type flip-flop.

FIG. 12 is a circuit diagram showing the third example of a specific D-type flip-flop circuit configuration. Note that the circuit shown in FIG. 12 is a D-type flip-flop of 2-bit master-slave type.

In FIG. 12, the master D-type flip-flop is constituted by inverter circuits 1222, 1223 and transmission gate circuits 1224, 1225. A transmission gate circuit is constituted by N-type M0SFET and P-type M0SFET that are connected with each other in parallel, where each gate electrode has a function as a switch that implements on/off control by applying a signal of the opposite phase. A M0SFET stands for "Metal-Oxide-Semiconductor Field-Effect Transistor." In the master D-type flip-flop, the inverter circuits 1222, 1223 constitute a latch circuit via the transmission gate circuit 1225. This flip-flop also has a data transfer function (D to Bit-inverted M in FIG. 12) and data latch function (Bit-inverted M) via the transmission gate circuits 1224, 1225.

On the other hand, the slave D-type flip-flop is constituted by inverter circuits 1232, 1233 and transmission gate circuits 1234, 1235.

In the slave D-type flip-flop, the inverter circuits 1232, 1233 constitute a latch circuit via the transmission gate circuit 1235. This flip-flop also has a data transfer function (Bit-inverted M to Q in FIG. 12) and data latch function (Bit-inverted M) via the transmission gate circuits 1234, 1235.

Also in FIG. 12, the inverter circuits 1204, 1205 generate a bit-inverted signal and double-bit-inverted signal (i.e., normal signal) of CL, respectively, to be supplied to the transmission gate circuits 1224, 1225, 1234, 1235.

As explained above, in FIG. 12 the master D-type flip-flop and slave D-type flip-flop are controlled by anti-phase control signals CL, respectively, and therefore the circuit shown in FIG. 12 operates as a D-type flip-flop of 2-bit master-slave type.

FIG. 10 is a circuit diagram showing a D-type flip-flop of a configuration different from that in FIG. 9. The circuit in FIG. 10 is a D-type flip-flop of 1-bit master type.

In FIG. 10, a latch circuit constituted by crisscrossed I/O line of NAND circuits 1002, 1003 is combined with NAND circuits 1001, 1004 and inverter circuit 1005, to form a D-type flip-flop that has input data signal D, control clock signal CL, output signal Q, and inversion output signal of Q. The circuit configuration in FIG. 10 is well-known and thus not explained in detail.

FIG. 13 is a circuit diagram showing the configuration of a 2-bit master-slave flip-flop constituted by two of the D-type flip-flop of 1-bit mater type shown in FIG. 10.

In FIG. 13, the circuit constituted by NAND circuits 1001, 1002, 1003, 1004 and inverter circuit 1005 is exactly the same as the circuit in FIG. 10. In FIG. 13, the configurations of NAND circuits 1301, 1302, 1303, 1304 correspond to those of NAND circuits 1001, 1002, 1003, 1004, respectively, where each pair of corresponding NAND circuits basically have the same function. FIG. 13 shows a 2-bit master-slave flip-flop whose detailed explanation is omitted.

FIGS. 9 to 13 above showed various configuration examples including D-type flip-flops of 1-bit master type and 2-bit master-slave type. It is clear that D-type flip-flops are available in various functions and configurations. An optimal D-type flip-flop configuration can be selected according to the specific purpose.

In addition to D-type flip-flops, flip-flops are also available in various other types such as RS-type flip-flops, JK-type flip-flops and T-type flip-flops. The functions and configurations of these other flip-flops are well-known and thus not explained in detail.

Any flip-flop can be selected from these various types for installation in the MLUT block as needed.

(Distant Line)

Next, distant line between MLUTs is explained. The difference between distant line and adjacent line was briefly explained earlier, but for clarification purposes, some aspects of this difference are explained in detail below, risking redundancy.

FIGS. 1, 6, etc., only show adjacent line by omitting distant line. The following describes the distant line.

First, the definitions of distant line and adjacent line are again provided below.

Adjacent line refers to interconnects between adjacent MLUTs on a same plane.

Distant line refers to interconnects between non-adjacent MLUTs or MLUT blocks on the same plane.

Adjacent line use address-data pairs P0 to P5 shown in FIG. 5.

Distant line use address-data pair P6 shown in FIG. 5.

In FIG. 1, address-data pair P6 is used for a D-type flip-flop in the case of MLUT M4, but with MLUTs M0 to M3 and MLUTs M5 to M8, address-data pair P6 is all used for distant line. Note that all wirings shown in FIG. 1 are adjacent line by means of address-data pairs P0 to P5, and no distant line by address-data pair P6 are illustrated.

On the other hand, the wiring diagram in FIG. 16 shows a MLUT block constituted by MLUTs M0 to M8, where adjacent line by address-data pairs P0 to P5 are not shown, and only distant line by address-data pair P6 are shown.

In FIG. 16, the MLUT block is constituted by nine MLUTs from M0 to M8. A D-type flip-flop is attached only to MLUT M4, although this D-type flip-flop is not illustrated. Because a D-type flip-flop is attached to MLUT M4, its address-data pair P6 is used for the flip-flop and not available for distant line. As you can see, distant line by the address-data pairs P6 of MLUTs M0 to M3 and MLUTs M5 to M8 are extending to outside the MLUT block. Also, MLUT M4 is denoted by a square, while MLUTs M0 to M3 and MLUTs M5 to M8 are denoted by circles, to express the difference between these MLUTs in that only M4 has a D-type flip-flop and no distant line, which is not the case with M0 to M3 and M5 to M8.

The wiring diagrams in FIG. 17 show two types of connection patterns for distant line. There are various possibilities on how distant line are implemented in a MLUT block, but in FIG. 17, only two distant interconnect patterns are illustrated. In FIG. 17(a), distant line by the address-data pairs P6 of MLUTs M0 and M5 extend downward, while distant line by the address-data pairs P6 of MLUTs M3 and M8 extend upward. This pattern illustrated by FIG. 17(a) is called distant line pattern 1. In FIG. 17(b), on the other hand, distant line by the address-data pairs P6 of MLUTs M0 and M5 extend upward, while distant line by the address-data pairs P6 of MLUTs M3 and M8 extend downward. This pattern illustrated by FIG. 17(b) is called distant line pattern 2.

If two MLUT blocks having distant line patterns 1 and 2 in FIG. 17(a), (b), respectively, are arranged on top of each other, where distant line by the address-data pairs P6 of MLUTs M0 and M5 under distant line pattern 1 shown in FIG. 17(a) extend downward, while distant line by the address-data pairs P6 of MLUTs M0 and M5 under distant line pattern 2 shown in FIG. 17(b) extend upward, MLUTs M0 and M5 in the two MLUT blocks having distant line patterns 1 and 2, respectively, match with one another in terms of wiring position relationship.

If two MLUT blocks having distant line patterns 1 and 2 in FIG. 17(a), (b), respectively, are arranged on top of each other, but upside down compared to the aforementioned position relationship so that distant line pattern 2 comes to the top and distant line pattern 1 comes to the bottom, then distant line by the address-data pairs P6 of MLUTs M3 and M8 under distant line pattern 2 shown in FIG. 17(b) extend downward, while distant line by the address-data pairs P6 of MLUTs M3 and M8 under distant line pattern 1 shown in FIG. 17(a) extend upward, which means that MLUTs M3 and M8 in the two MLUT blocks having distant line patterns 2 and 1, respectively, match with one another in terms of wiring position relationship.

Note that under the aforementioned distant line patterns of 1 and 2, the distant line patterns of MLUTs M1, M2, M6, M7 are the same. Even if two MLUT blocks, both having the aforementioned distant line pattern of 1 or 2, are arranged side by side, their MLUTs are still wired in a matching manner, without problem, if the pattern in FIG. 17(a) or (b) is followed. In other words, wirings can be connected based on matching positions even when MLUT blocks of the same distant line pattern are combined.

FIG. 18 is a wiring diagram showing parts of distant line among MLUTs in tiled MLUT blocks based on a combination of distant line patterns 1 and 2 shown in FIG. 17(a) and (b), respectively. Since the purpose here is to show the layout of distant line among MLUTs in vertically and laterally adjacent MLUT blocks, distant line connecting MLUT blocks not vertically or laterally adjacent to each other, or distant line that would make the diagram too busy to understand, are intentionally omitted.

In FIG. 18, a MLUT block 1801 is constituted according to distant line pattern 1 as mentioned above, while a MLUT block 1802 is constituted according to distant line pattern 2. Clearly the distant line of MLUTs M0, M5 in the MLUT block 1801 and those of MLUTs M0, M5 in the MLUT block 1802 are arranged with matching wiring connections in upward and downward directions in terms of distant line position relationship.

Also in FIG. 18, a MLUT block 1803 is constituted according to distant line pattern 2 as mentioned above. As noted above, the MLUT block 1801 is constituted according to distant line pattern 1. Accordingly, as shown, the downward distant line of MLUTs M3, M8 in the MLUT block 1803 and the upward distant line of MLUTs M3, M8 in the MLUT block 1801 are arranged with matching wiring connections in terms of distant line position relationship.

FIG. 19 is a block layout diagram showing an efficient combination of layout patterns when MLUT blocks having distant line are arranged in an orderly manner on a plane.

The MLUT blocks arranged in FIG. 19 are the same shape as those in FIG. 18. If a layout pattern is to be repeated automatically to achieve an efficient arrangement, however, the combination of MLUT blocks in FIG. 18 can become complex, because multiple types of distant line patterns are used, and consequently the layout design may require a long time or design errors may occur.

FIG. 19 shows an efficient combination of MLUT blocks based on repetition of the same pattern. In FIG. 19, MLUT blocks 1801, 1802, 1803 directly correspond to the MLUT blocks 1801, 1802, 1803 in FIG. 18. In FIG. 19, the block unit consisting of 4×4 blocks inside a broken line 1910, which includes the MLUT blocks 1801, 1802, but not the MLUT block 1803, is considered.

Here, the MLUT block 1802 conforms to distant line pattern 2, while the MLUT block 1803 also conforms to distant line pattern 2, and in this sense the same pattern is repeated for each group of 4×4 MLUT blocks provided above and below the broken line 1901 and, because the same lateral distant line pattern is shared by the MLUT blocks in the broken line 1901, a structure can be achieved automatically where all MLUT blocks are arranged with matching wiring connections in terms of distant line position relationship as long as they are arranged on a plane in an orderly manner according to the basic unit of 4×4 MLUT blocks shown in the broken line in FIG. 19.

(Torus Interconnect and Torus Network)

Next, a torus interconnect, which is a method to improve signal transmission characteristics over distant line, is described. When many cells having the same configuration are arranged on a plane, the same signal wire may be shared by cells. FIG. 22 is a wiring diagram where one signal wire is used to connect each pair of cells in a simple manner. If one signal wire is used to connect each pair of cells, as shown in FIG. 22, cell 0 and cell 5 at the end points are connected to only one signal wire, while cells 1 to 4 are connected to two signal wires. This means that there is no symmetry between the end-point cells 0, 5 and intermediate cells 1 to 4, at least in terms of the number of signal wires through which a signal is received, and therefore characteristic differences exist between these groups of cells. In other words, there is difference at the end points.

FIG. 23 is a wiring diagram where the end-point cells 0, 5 are connected by an additional signal wire not found in FIG. 17, in order to eliminate the difference of signal wire number at the end points. This method eliminates the problem of cells having different numbers of signal wires through which a signal is received. In FIG. 23, however, the signal wire directly connecting the end-point cells 0, 5 is abnormally long compared to the lengths of connection wires between other pairs of cells. This leads to different electrical characteristics in terms of parasitic capacitance, noise susceptibility, etc., and consequently symmetry cannot be ensured among the cells.

FIG. 24 is a wiring diagram where an attempt is made to further eliminate the difference of signal wire number at the end points. In FIG. 24, cell 0 at the left end is connected by a signal wire to cell 2 positioned two cells away, while cell 2 is connected by a signal wire to cell 4 positioned two cells away, and cell 5 at the right end is connected by a signal wire to cell 3 positioned two cells away. Similarly, cell 3 is connected by a signal wire to cell 1 positioned two cells away. Note that the connections from cell 4 to cell 5, and from cell 1 to cell 0, are between adjacent cells, but these are exceptions and the basic approach here is to connect cells by skipping one cell in between. This way, all signal wires fall within the maximum signal wire interval, which is the distance between two cells with one cell skipped in between. As a result, the number of signal wires through which a signal is received and signal-wire connection interval become roughly equivalent among all cells and each cell has uniform electrical characteristics, which makes it easier to control the cells and maintain their stable performance. This wiring method, where cells are wired in a loop pattern by skipping one cell in between to ensure uniform, stable performance, is generally called a torus interconnect.

While FIG. 24 shows a type of torus interconnect where each pair of cells are connected by one wire, multiple wires, such as address wires, may be used to connect each pair of cells, an example of which is illustrated in FIG. 21. Here, in a lateral direction one signal is transmitted through a loop using a pair of two wires based on a torus structure where one cell is skipped in between. Multiple sets of a signal pair conforming to this structure are also arranged. Not only in lateral direction, but also in vertical direction one signal is transmitted through a loop using a pair of two wires based on a torus structure where one cell is skipped in between. Here, too, multiple sets of a signal pair conforming to this structure are arranged. To summarize, in FIG. 21 multiple signal wires are arranged both laterally and vertically in a torus structure, and this structure is generally called a torus network.

FIG. 18 shows distant line between MLUTs and MLUT blocks conforming to the present invention, as explained above, but a torus structure is also used in some parts. In FIG. 18, the MLUT and MLUT block constitute basic units, respectively, so by wiring MLUTs or MLUT blocks by skipping M number (M is an integer of 1 or greater) of MLUTs or MLUT blocks in between, distant line can be achieved by a torus structure. Note that in FIG. 18, it can be interpreted as either six MLUTs are skipped or one MLUT block is skipped, but both interpretations mean the same thing.

By constituting a torus structure or torus structure in units of MLUTs or MLUT blocks this way, the present invention can provide optimal distant line having uniform, stable characteristics, even when the wiring distance is different.

Also note that, while one MLUT or MLUT block was skipped in the example explained above, it is also possible to skip two or more MLUTs or MLUT blocks.

As long as the same number of MLUTs or MLUT blocks are skipped, distant line of uniform, stable characteristics can be obtained.

(Example of Distant Line Using Torus Interconnect)

Now, FIG. 20 is a wiring diagram showing an example of applying a torus interconnect to a distant line based on an orderly planar arrangement of MLUT blocks conforming to the present invention. In FIG. 20, MLUT blocks 2001, 2002, 2003, 2004, 2005, 2006 have distant line based on distant line pattern 1 or 2 shown in FIG. 17(*a*) or (*b*), respectively. These distant line can be implemented according to the concept of torus interconnect explained above.

In FIG. 20 where the MLUT blocks 2001, 2002, 2003, 2004, 2005, 2006 are arranged in an orderly manner on a plane, the MLUT block 2002 is wired to the MLUT block 2004, via a distant line 2R24, by skipping one MLUT block denoted by 2003 in between. Similarly, the MLUT block

2004 is wired to the MLUT block 2006, via a distant line 2R46, by skipping one MLUT block denoted by 2005 in between. The above is illustrated by assuming that the MLUT blocks 2002, 2003, 2004, 2005, 2006 are wired on the right side.

On the other hand, the MLUT block 2001 is wired to the MLUT block 2003, via a distant line 2L13, by skipping one MLUT block denoted by 2002 in between. Similarly, the MLUT block 2003 is wired to the MLUT block 2005, via a distant line 2L35, by skipping one MLUT block denoted by 2004 in between. The above is illustrated by assuming that the MLUT blocks 2001, 2002, 2003, 2004, 2005, 2006 are wired on the left side.

As explained above, the MLUT blocks 2001, 2002, 2003, 2004, 2005, 2006 are wired on the right side via distant line 2R24, 2R46 by skipping one MLUT block in between, and on the left side via distant line 2L13, 2L35 by also skipping one MLUT block in between. While all areas are not explained, the foregoing shows that the aforementioned torus interconnect can be applied to vertical distant line connecting MLUT blocks arranged in an orderly manner on a plane. The aforementioned torus interconnect can also be applied to lateral distant line connecting MLUT blocks arranged in an orderly manner on a plane. In other words, a torus interconnect can be applied to both vertical and lateral distant line, which means that the group of MLUT blocks in FIG. 20 constitute a torus interconnect network.

(Other Embodiments)

The present invention is not at all limited to the above embodiments. Examples of such other embodiments are given below.

While the MLUT block is based on a combination of nine MLUTs in the aforementioned configurations of the present invention, MLUT blocks can have any other configuration based on a general pattern of K×L (K and L are integers of 1 or greater).

In the case of this K×L configuration, one MLUT block can have multiple MLUTs accompanied by a flip-flop.

As long as the basic configuration of K×L (K and L are positive integers of 1 or greater) is followed, other circuit elements can be placed, instead of MLUTs, in some cells within the grid.

Also note that, while MLUTs and MLUT blocks are arranged on a plane in the above examples, they can also be installed three-dimensionally as long as the chips are stacked.

Furthermore in the examples of FIGS. 1, 2 and 5, six (six pairs) out of seven address-data pairs are used for adjacent line, while one (one pair) of them is used for distant line. As shown in FIG. 3, however, there can be a total of eight address-data pairs from P0 to P7, or more pairs can be used. If the total number is eight, from P0 to P7, the memory size of the memory block in FIG. 4 will increase, but one address-data pair for an adjacent line can be added to those shown in FIG. 1, or one pair for a distant line can be added to the one although it is not shown in FIG. 1.

If the combination of MLUTs does not conform to the above configuration of 3×3, but conforms to a general configuration of K×L (K and L are positive integers of 1 or greater), then there will be an appropriate number of address-data pairs suitable for the actual condition, other than the numbers mentioned above.

Also in the foregoing explanations, the memory block 40 in the MLUT is constituted by SRAMs, as shown in FIG. 4, but it can also be constituted by nonvolatile memories. One benefit is that if the memory block 40 is constituted by nonvolatile memories and the MLUT in FIG. 4 has a logic circuit function, the circuit function that has been set can operate immediately when the power is turned on, even when the power is cut off and then turned on again, because the memories are nonvolatile. Use of nonvolatile memories also provides the benefit of permitting immediate use of the MLUT when the power is turned on, even when it is used as a memory circuit. Note that nonvolatile memories include EEPROMs (Erasable Programmable Read Only Memories) (including flash types), FeRAMs (Ferroelectric Random Access Memories) and MRAMs (Magneto-resistive Random Access Memories), among others.

Also in the above examples, the MLUT has the configuration shown in FIG. 4, but its configuration need not conform to FIG. 4. The memory block may not be based on the configuration of n×($2^n$), but it can take any other configuration and address and data wires can also be shared depending on the situation.

Furthermore in the above examples illustrated by FIGS. 1 and 6, there is only one flip-flop. However, multiple flip-flops may be installed. If multiple flip-flops are installed to form a sequential circuit, a complex sequential circuit can be realized because many previous states can be handled.

If these flip-flops are used for synchronization purposes based on control signals, synchronization or control using two-phase clock signals or multiple different control signals becomes possible, which allows for designing of a circuit offering higher function.

Also in the foregoing, FIGS. 1 and 6 are explained based on the D-type flip-flop, while the RS type, JK type and T type are mentioned as examples of other flip-flops, but in addition to pure flip-flops, other circuit elements may be proven effective depending on the situation. For examples, registers and counters may be used. If registers are installed, a circuit offering higher speed and function can be designed, such as a pipeline adder that calculates all digits in parallel, virtually simultaneously, instead of waiting for carrying from the lower digits as in the case of the 4-bit addition circuit illustrated in FIG. 8.

Also in FIG. 17(*a*), (*b*), two types of distant line patterns of 1 and 2 are shown based on vertical wirings, but lateral wirings also have two types of distant line patterns. In other words, there are two patterns in a vertical direction and two patterns in a lateral direction, meaning that at least four types of distant line patterns are available by combining the above. Any combination of such other distant line patterns can be used.

In addition, examples of applying a torus interconnect to distant line were also given above, where a torus interconnect was explained as one way to cancel out the variation in electrical characteristics at end points caused by the effect of difference. If two-dimensional and three-dimensional planes and curved surfaces are considered, however, there are many situations where a non-torus topology is involved. By using a multi-layer wiring structure, such other topology can be simulated. For example, structures equivalent to a sphere, hyper-cube, etc., can be simulated to not only eliminate the aforementioned difference at end points, but also to cancel out variations due to spatial position during the manufacturing process or noise and other phenomena that vary from position to position.

Industrial Field of Application

The present invention provides a programmable LSI whose function can be changed as necessary and which is less expensive and more functionally stable than conventional FPGAs. It is also less expensive and easier to design a synchronous circuit or sequential circuit with, and offers higher function and performance, than early MPLDs. Accordingly, the present invention may replace conventional FPGAs, etc., and find wider applications as a programmable LSI offering greater cost performance, or as a programmable LSI suitable for models having multiple varieties produced in small volumes, models subject to function change or other new products to be developed.

Description of the Symbols

M0 to M8, 611, 612, 1401, 1551 to 1553, 1561 to 1563 MLUTs
P0 to P6 Adjacent line by means of address-data pairs
11, 621, 1402, 1551 D-type flip-flops
40 Memory block constituted by SRAMs
41 Address switching circuit
42 Address decoder
43 Output data switching circuit
44 Data input for memory operation
45 Address input for memory operation
46 Data output for memory operation
47 Address input for logic operation
48 Data output for logic operation
49 Signal for switching operation
51 Address wire data input
52 Data output
4446 Memory operation data I/O
601, 1801 to 1803, 2001 to 2006 MLUT blocks
MLA1 to MLA4 MLUT-based 1-bit adder
MLS 1 to MLS4 MLUT-based switches
1521 Group of D-type flip-flops
2L13, 2L35, 2R24, 2R46 Distant line

The invention claimed is:

1. A semiconductor device characterized by comprising a basic unit being a MLUT block constituted by N number (N is an integer of 1 or greater) of MLUTs each having a memory and I/O signal wires that are address wires and data wires arranged/wired in pairs; wherein the MLUTs are interconnected by the address-data pairs, and a plurality of the basic units, or MLUT blocks, are arranged and a flip-flop is provided for the MLUT block.

2. A semiconductor device according to claim 1, characterized in that the flip-flop is a D-type flip-flop.

3. A semiconductor device according to claim 2, characterized in that a plurality of the flip-flops are provided.

4. A semiconductor device according to claim 3, characterized in that signal connections between the MLUTs or MLUT blocks include distant lines that are pairs of address wires and data wires connecting MLUTs or MLUT blocks not adjacent to each other on a same plane.

5. A semiconductor device according to claim 4, characterized in that the distant lines include those conforming to a structure where MLUTs or MLUT blocks are wired in a loop pattern formed by skipping one or more cells in between.

6. A semiconductor device according to claim 2, characterized in that the I/O signal wirings between the MLUTs, based on pairs of address wires and data wires, conform to an interleaved interconnect where the wires are led out and arranged symmetrically between the MLUTs.

7. A semiconductor device according to claim 6, characterized in that signal connections between the MLUTs or MLUT blocks include distant lines that are pairs of address wires and data wires connecting MLUTs or MLUT blocks not adjacent to each other on a same plane.

8. A semiconductor device according to claim 7, characterized in that the distant lines include those conforming to a structure where MLUTs or MLUT blocks are wired in a loop pattern formed by skipping one or more cells in between.

9. A semiconductor device according to claim 2, characterized in that signal connections between the MLUTs or MLUT blocks include distant lines that are pairs of address wires and data wires connecting MLUTs or MLUT blocks not adjacent to each other on a same plane.

10. A semiconductor device according to claim 9, characterized in that the distant lines include those conforming to a structure where MLUTs or MLUT blocks are wired in a loop pattern formed by skipping one or more cells in between.

11. A semiconductor device according to claim 1, characterized in that a plurality of the flip-flops are provided.

12. A semiconductor device according to claim 11, characterized in that signal connections between the MLUTs or MLUT blocks include distant lines that are pairs of address wires and data wires connecting MLUTs or MLUT blocks not adjacent to each other on a same plane.

13. A semiconductor device according to claim 12, characterized in that the distant lines include those conforming to a structure where MLUTs or MLUT blocks are wired in a loop pattern formed by skipping one or more cells in between.

14. A semiconductor device according to claim 1, characterized in that the memory is SRAM (Static Random Access Memory).

15. A semiconductor device according to claim 1, characterized in that the memory is a nonvolatile memory.

16. A semiconductor device according to claim 1, characterized in that the I/O signal wirings between the MLUTs, based on pairs of address wires and data wires, conform to an interleaved interconnect where the wires are led out and arranged symmetrically between the MLUTs.

17. A semiconductor device according to claim 16, characterized in that signal connections between the MLUTs or MLUT blocks include distant lines that are pairs of address wires and data wires connecting MLUTs or MLUT blocks not adjacent to each other on a same plane.

18. A semiconductor device according to claim 17, characterized in that the distant lines include those conforming to a structure where MLUTs or MLUT blocks are wired in a loop pattern formed by skipping one or more cells in between.

19. A semiconductor device according to claim 1, characterized in that signal connections between the MLUTs or MLUT blocks include distant lines that are pairs of address wires and data wires connecting MLUTs or MLUT blocks not adjacent to each other on a same plane.

20. A semiconductor device according to claim 19, characterized in that the distant lines include those conforming to a structure where MLUTs or MLUT blocks are wired in a loop pattern formed by skipping one or more cells in between.

* * * * *